US012701779B2

(12) United States Patent
More et al.

(10) Patent No.: US 12,701,779 B2
(45) Date of Patent: Aug. 4, 2026

(54) EPITAXIAL SOURCE/DRAIN STRUCTURES FOR MULTIGATE DEVICES AND METHODS OF FABRICATING THEREOF

(71) Applicant: Taiwan Semiconductor Manufacturing Company, Ltd., Hsin-Chu (TW)

(72) Inventors: Shahaji B More, Hsinchu City (TW); Cheng-Han Lee, New Taipei City (TW)

(73) Assignee: AIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 436 days.

(21) Appl. No.: 17/685,796

(22) Filed: Mar. 3, 2022

(65) Prior Publication Data

US 2022/0392894 A1     Dec. 8, 2022

Related U.S. Application Data

(60) Provisional application No. 63/196,794, filed on Jun. 4, 2021.

(51) Int. Cl.
H10D 84/83          (2025.01)
H10D 84/01          (2025.01)
H10D 84/03          (2025.01)

(52) U.S. Cl.
CPC ......... H10D 84/83 (2025.01); H10D 84/0128 (2025.01); H10D 84/013 (2025.01); H10D 84/038 (2025.01)

(58) Field of Classification Search
CPC ........... H01L 27/088; H01L 21/823412; H01L 21/823418; H01L 21/823814; H01L 29/1079; H01L 29/161; H01L 29/165; H01L 27/092; H01L 29/0673; H01L 29/0847; H01L 29/42392; H01L 29/66439; H01L 29/775; H01L 29/7848;
(Continued)

(56) References Cited

U.S. PATENT DOCUMENTS 11,508,621 B2 * 11/2022 More ................... H10D 30/031
11,949,016 B2 * 4/2024 Lin ......................... H10D 30/43
(Continued)

*Primary Examiner* — Bitew A Dinke
(74) *Attorney, Agent, or Firm* — HAYNES AND BOONE, LLP

(57) ABSTRACT

Epitaxial source/drain structures for enhancing performance of multigate devices, such as fin-like field-effect transistors (FETs) or gate-all-around (GAA) FETs, and methods of fabricating the epitaxial source/drain structures, are disclosed herein. An exemplary source/drain structure extends from a topmost channel layer to a depth into a semiconductor substrate. The source/drain structure includes an undoped epitaxial layer with a trough-shaped top surface, a first doped epitaxial layer over the undoped epitaxial layer, a second doped epitaxial layer over the first epitaxial layer, and a third doped epitaxial layer over the second doped epitaxial layer. A thickness of the undoped epitaxial layer is less than the depth of the epitaxial source/drain structure into the semiconductor substrate. The thickness and the depth are tuned based on a size of an active region to which the epitaxial source/drain structure belongs, such that the epitaxial source/drain structure mitigates short channel effects while optimizing performance.

20 Claims, 18 Drawing Sheets

(58) Field of Classification Search
CPC ....... H01L 29/78696; H01L 21/823807; H01L 21/823821; H01L 27/0924; B82Y 10/00; H10D 84/013; H10D 84/017; H10D 62/052; H10D 84/83
See application file for complete search history.

(56) References Cited

U.S. PATENT DOCUMENTS

| | | | | |
|---|---|---|---|---|
| 11,996,484 | B2 * | 5/2024 | Lin | H10D 30/6735 |
| 12,062,580 | B2 * | 8/2024 | More | H10D 84/017 |
| 12,294,030 | B2 * | 5/2025 | Lin | H10D 62/121 |
| 12,419,084 | B2 * | 9/2025 | Liu | H10D 62/151 |
| 2016/0064387 | A1 * | 3/2016 | Jeong | H01L 21/823821 |
| | | | | 257/401 |
| 2016/0087104 | A1 * | 3/2016 | Lee | H01L 29/66795 |
| | | | | 257/192 |
| 2016/0307898 | A1 * | 10/2016 | Kim | H01L 27/0922 |
| 2017/0062598 | A1 * | 3/2017 | Seo | H01L 29/775 |
| 2018/0294331 | A1 * | 10/2018 | Cho | H10D 62/102 |
| 2018/0350821 | A1 * | 12/2018 | Lin | H10B 10/12 |
| 2019/0067490 | A1 * | 2/2019 | Yang | H01L 29/1033 |
| 2019/0097006 | A1 * | 3/2019 | Li | H01L 29/66795 |
| 2019/0221640 | A1 * | 7/2019 | Reznicek | H01L 29/167 |
| 2019/0348403 | A1 * | 11/2019 | Mochizuki | H01L 21/0245 |
| 2019/0378920 | A1 * | 12/2019 | Chin | H01L 29/7848 |
| 2020/0006545 | A1 * | 1/2020 | Liu | H10D 62/151 |
| 2020/0035696 | A1 | 1/2020 | Zhu | |
| 2020/0066725 | A1 | 2/2020 | Bhuwalka et al. | |
| 2020/0168606 | A1 * | 5/2020 | Chan | H10D 64/017 |
| 2020/0220018 | A1 * | 7/2020 | Jang | H01L 29/0847 |
| 2020/0303521 | A1 * | 9/2020 | Son | H10D 62/121 |
| 2020/0312999 | A1 | 10/2020 | Reznicek et al. | |
| 2020/0365692 | A1 * | 11/2020 | Jung | H01L 29/785 |
| 2020/0381562 | A1 * | 12/2020 | Jung | H01L 29/66545 |
| 2021/0066477 | A1 * | 3/2021 | Lee | H10D 84/0158 |
| 2021/0098311 | A1 * | 4/2021 | Lin | H10D 84/853 |
| 2021/0104616 | A1 * | 4/2021 | Su | H10D 64/015 |
| 2021/0126135 | A1 * | 4/2021 | Lee | H01L 29/66545 |
| 2021/0151319 | A1 * | 5/2021 | Kim | H01L 29/6656 |
| 2021/0234020 | A1 * | 7/2021 | Mochizuki | H01L 29/42392 |
| 2021/0257499 | A1 * | 8/2021 | Shin | H10D 30/014 |
| 2021/0280683 | A1 * | 9/2021 | Trivedi | H01L 29/0649 |
| 2021/0375685 | A1 * | 12/2021 | Xie | H10D 62/151 |
| 2022/0069135 | A1 * | 3/2022 | Chu | H01L 29/775 |
| 2022/0181499 | A1 * | 6/2022 | Jung | H01L 29/0673 |
| 2024/0120381 | A1 * | 4/2024 | Shih | H10D 30/6735 |

* cited by examiner

EPITAXIAL SOURCE/DRAIN STRUCTURES FOR MULTIGATE DEVICES AND METHODS OF FABRICATING THEREOF

This application is a non-provisional application of and claims benefit of U.S. Provisional Patent Application Ser. No. 63/196,794, filed Jun. 4, 2021, the entire disclosure of which is incorporated herein by reference.

BACKGROUND

Recently, multigate devices, which have gates that extend, partially or fully, around a channel to provide access to the channel on at least two sides, have been introduced to improve gate control. Multigate devices enable aggressive scaling down of IC technologies, maintaining gate control and mitigating short-channel effects (SCEs), while seamlessly integrating with conventional IC manufacturing processes. However, as multigate devices continue to scale, advanced techniques are needed for optimizing multigate device reliability. Accordingly, although existing multigate devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
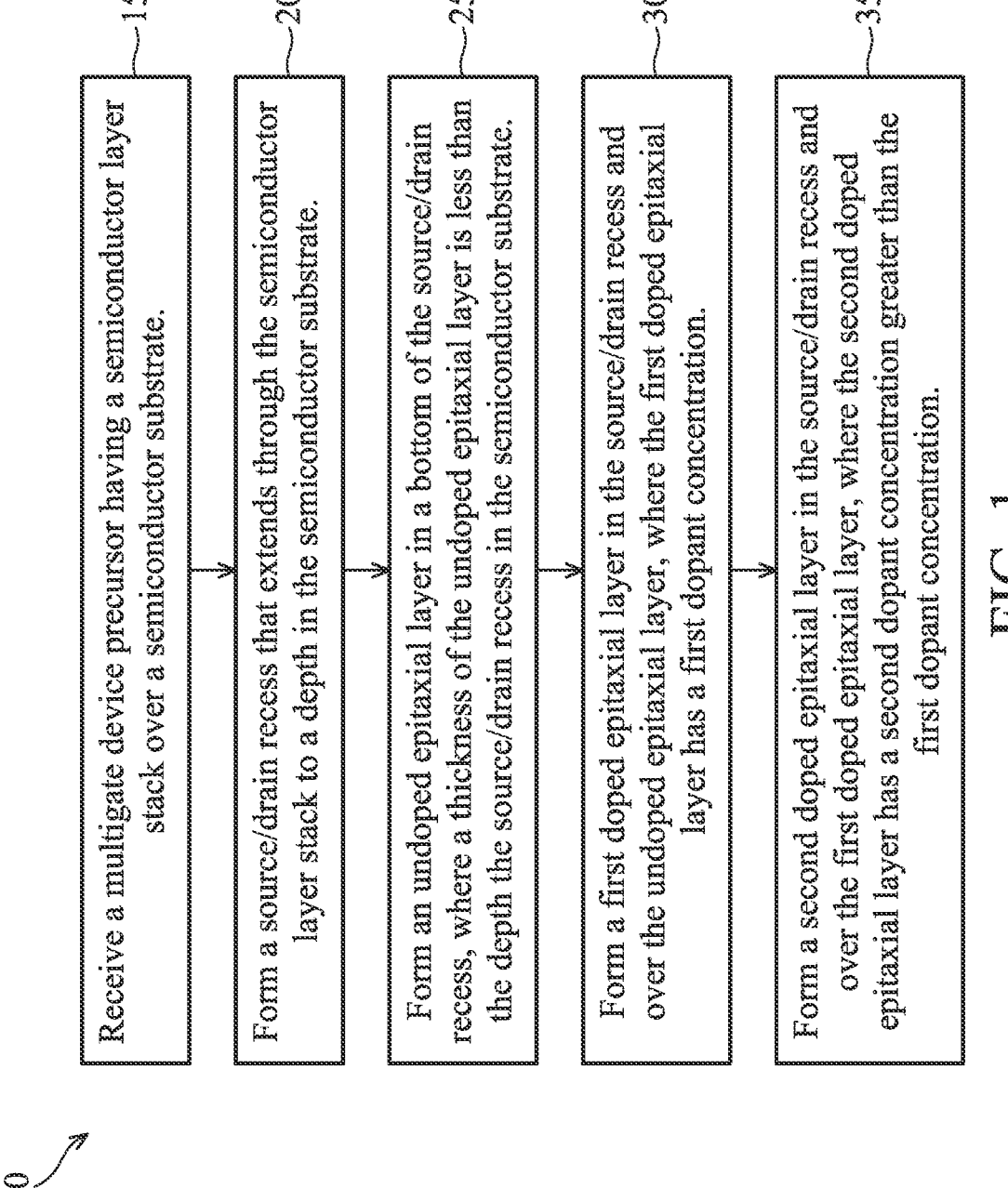
FIG. 1 is a flow chart of a method for fabricating a multigate device having enhanced epitaxial source/drain structures according to various aspects of the present disclosure.

The present disclosure relates generally to epitaxial source/drain structures for enhancing performance of multigate devices, such as fin-like field-effect transistors (FETs) or gate-all-around (GAA) FETs, and methods of fabrication thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Figure 2A:
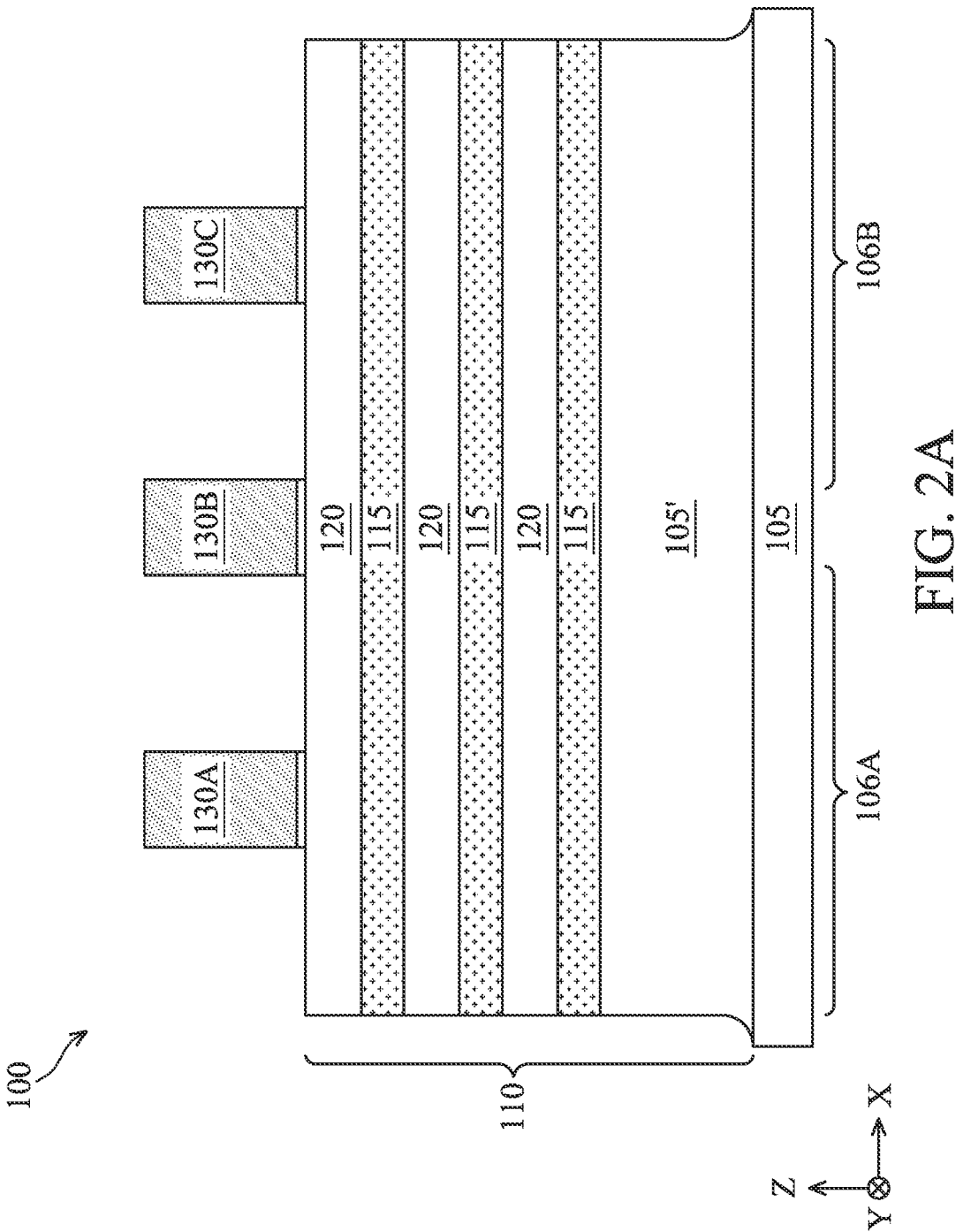
FIGS. 2A-2H are fragmentary cross-sectional views of a multigate device having enhanced epitaxial source/drain structures, in portion or entirety, at various fabrication stages associated with the method in FIG. 1 according to various aspects of the present disclosure.
Figure 2B:
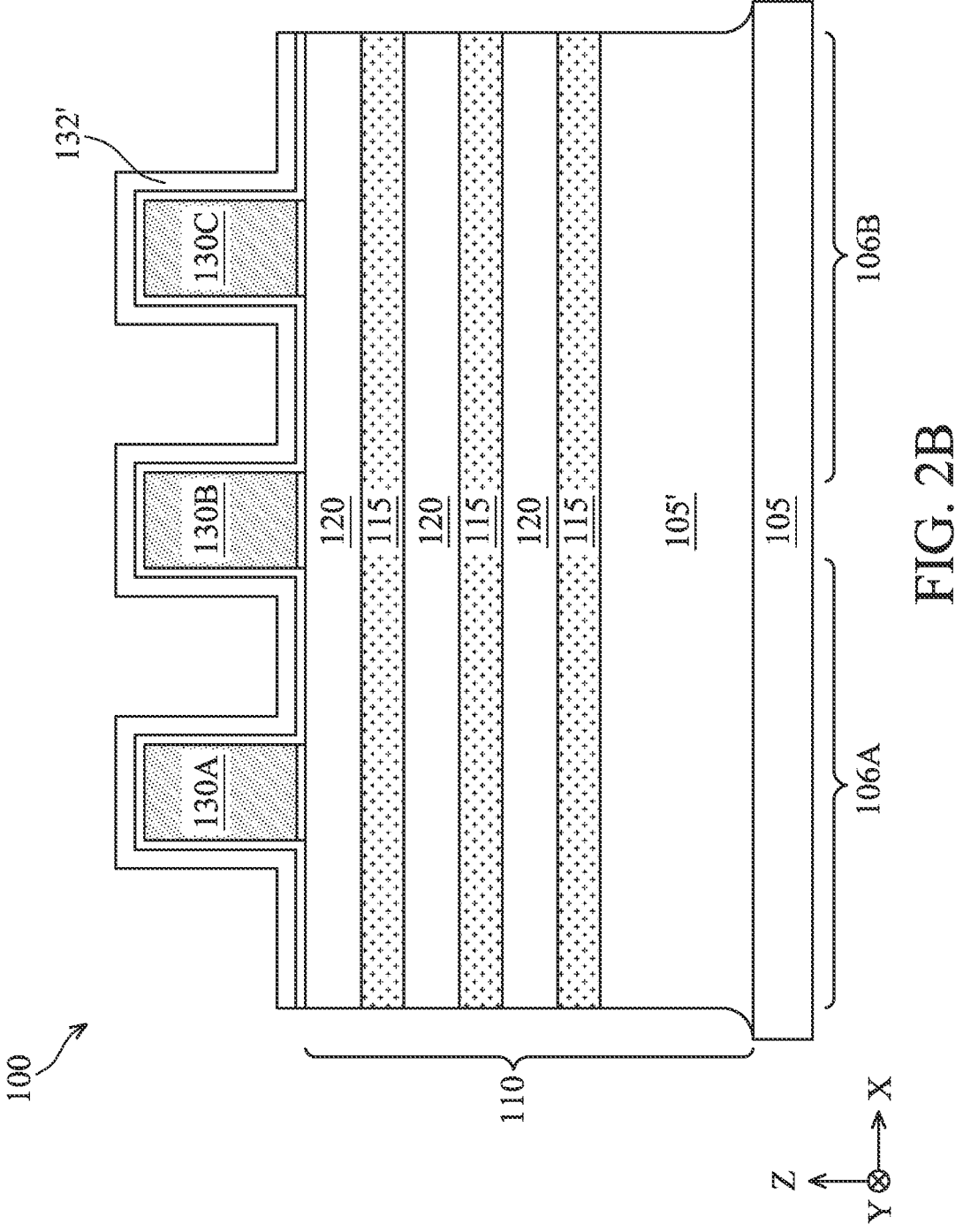
Figure 2C:
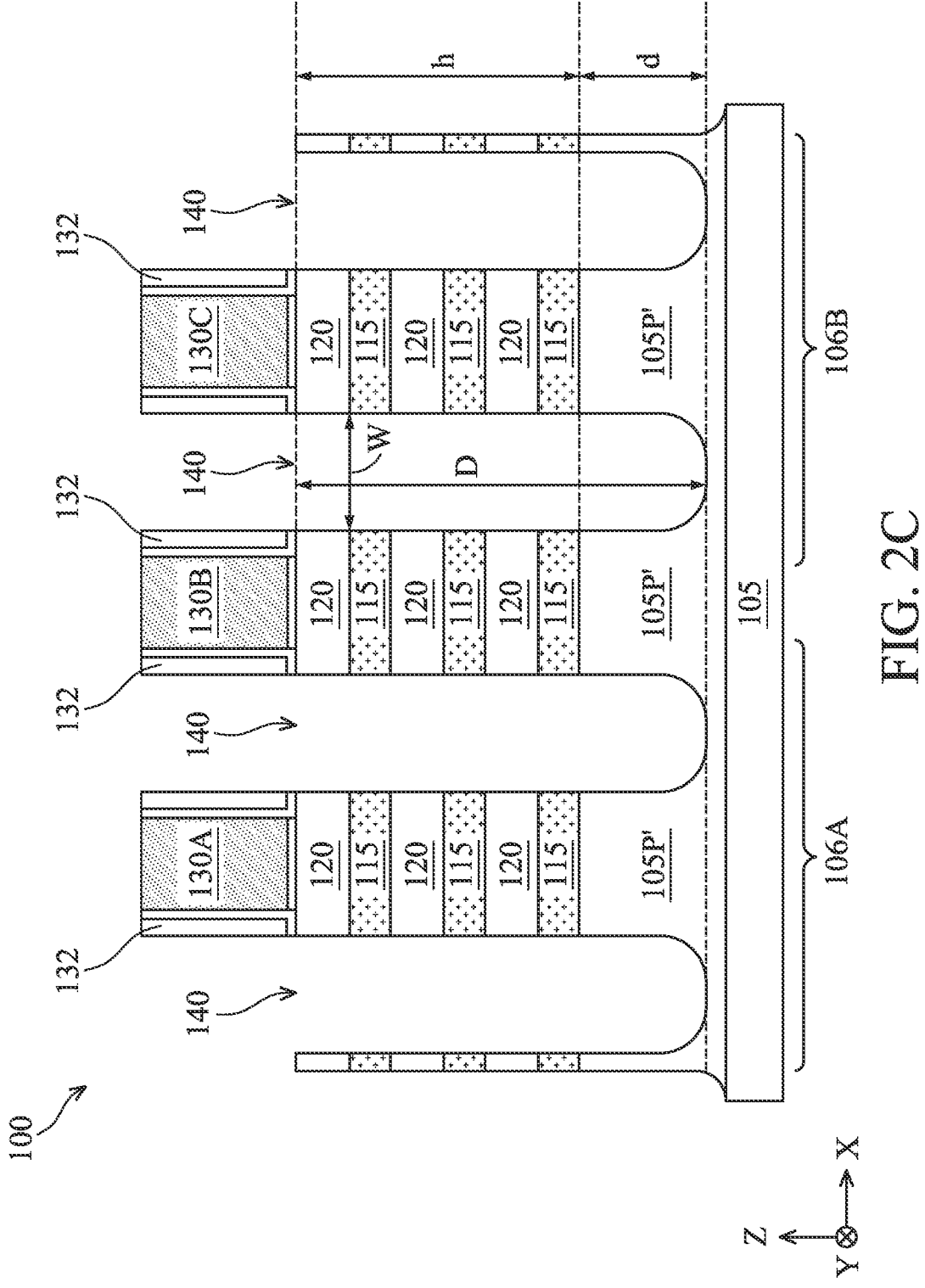
Figure 2D:
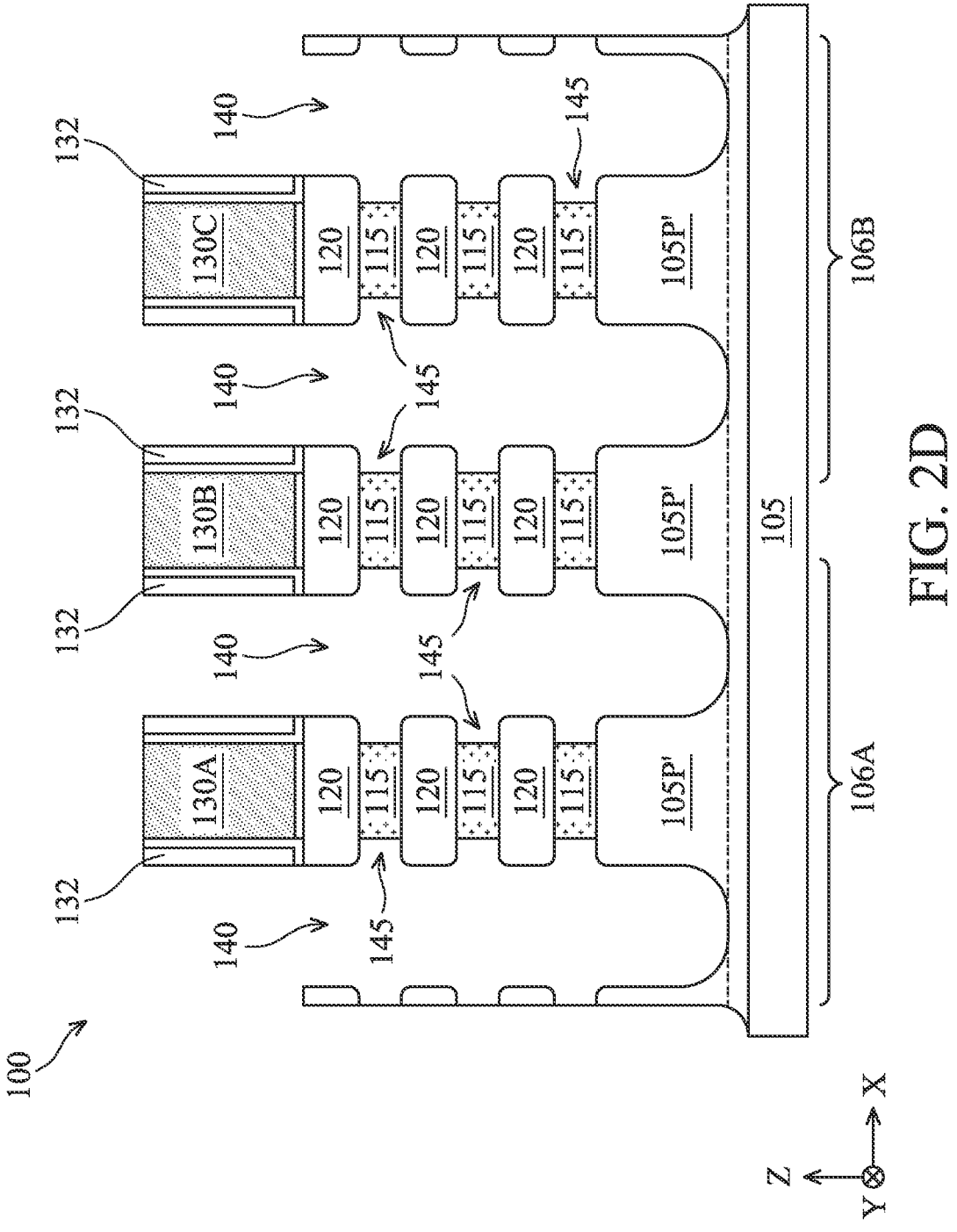
Figure 2E:
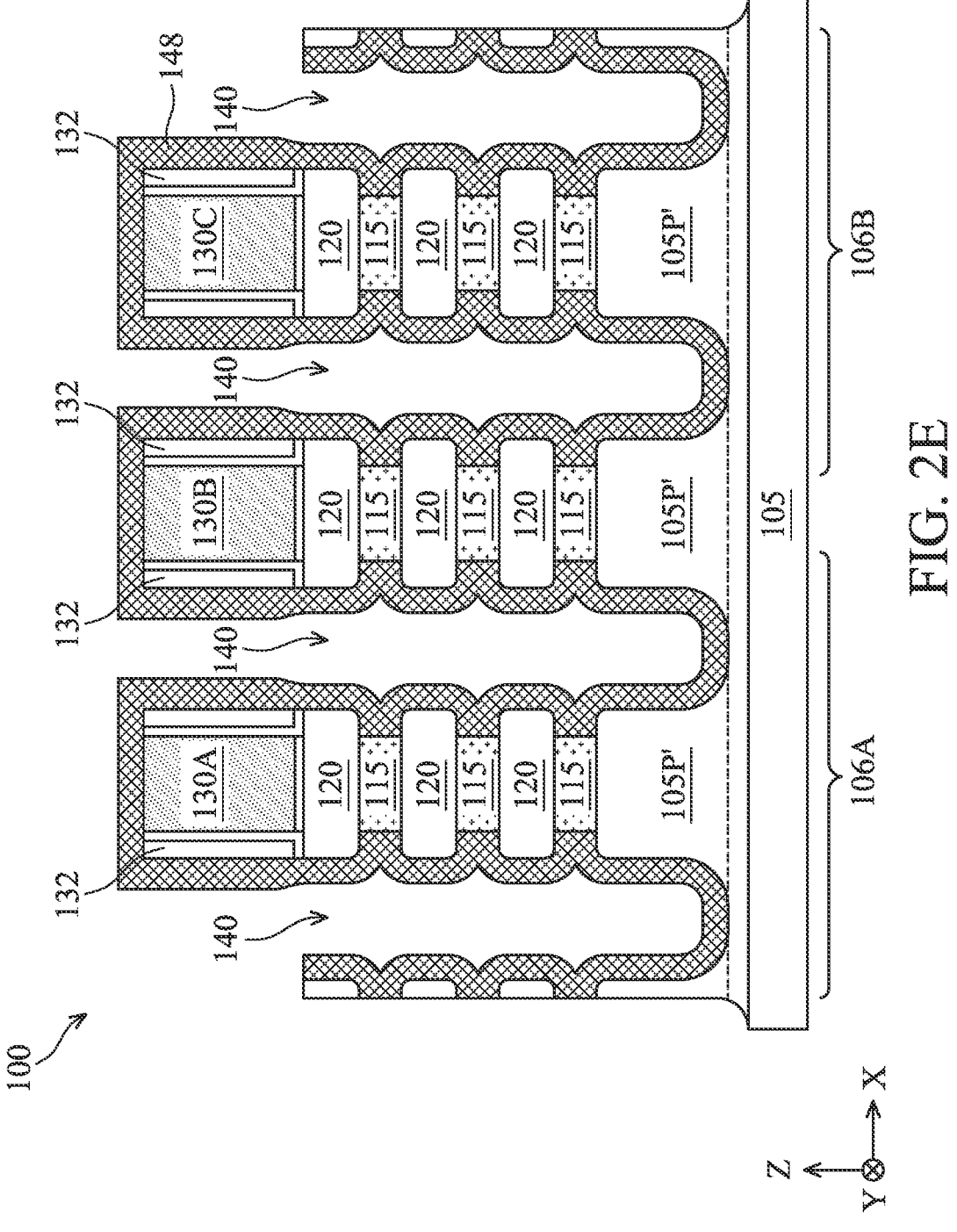
Figure 2F:
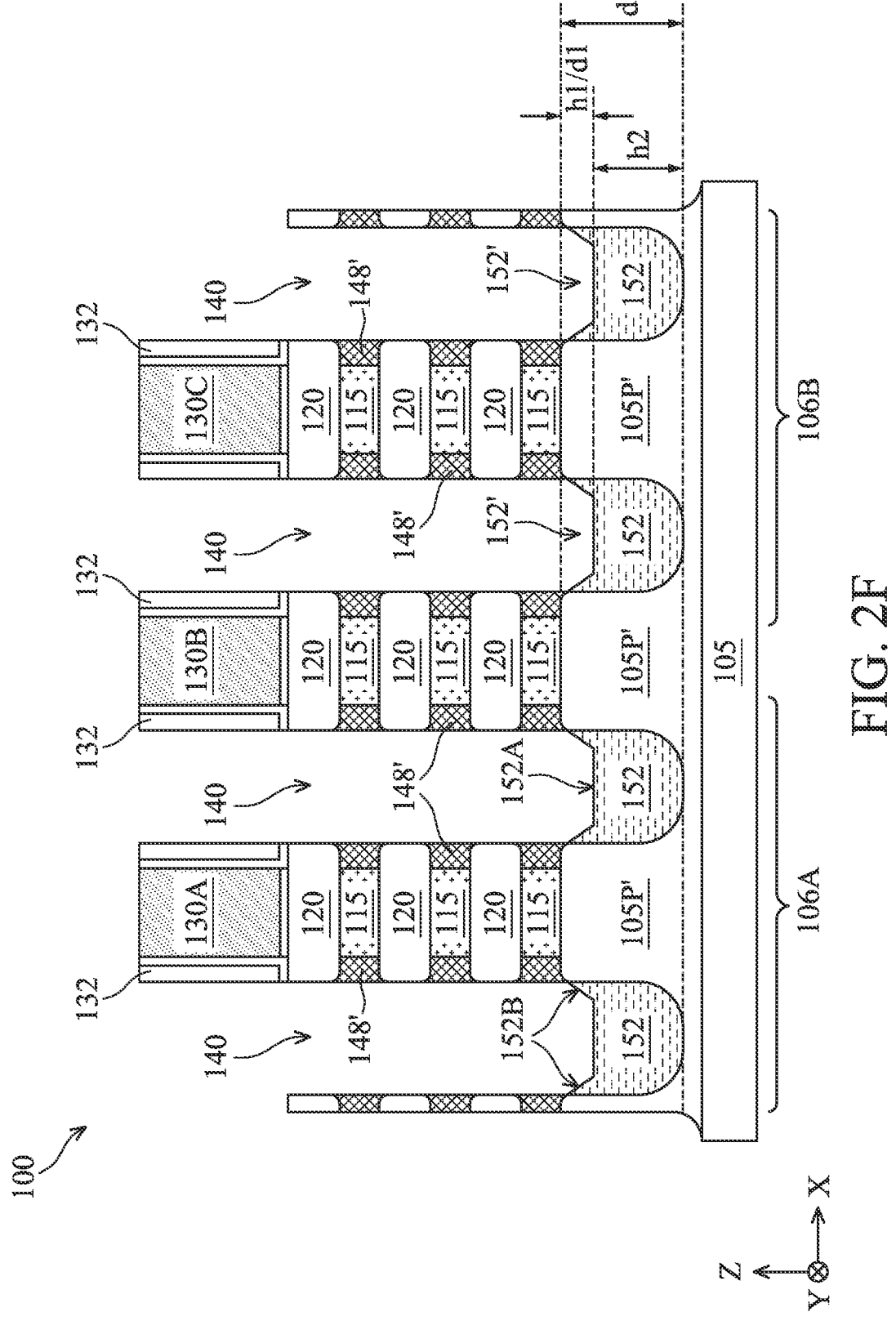
Figure 2G:
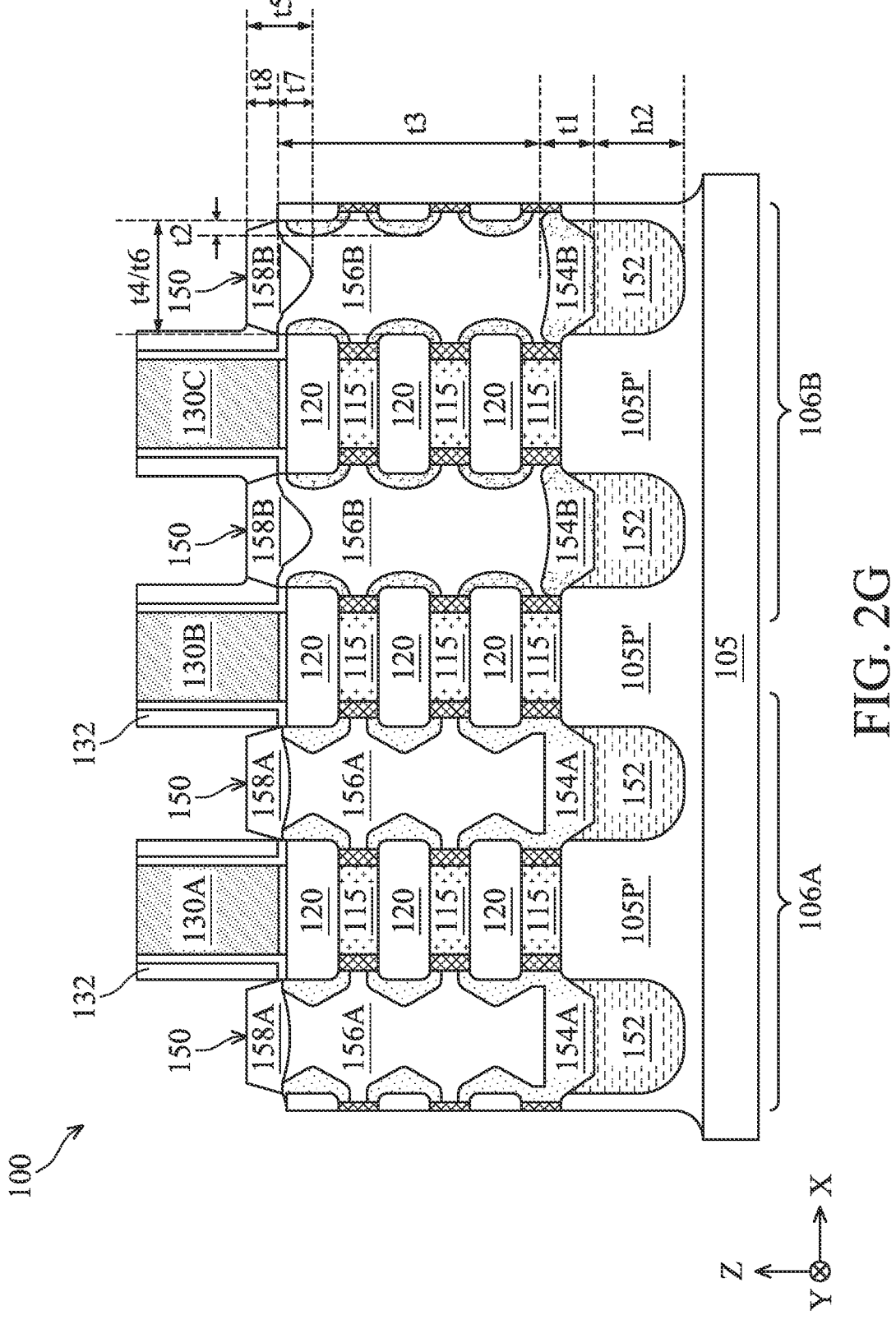
Figure 2H:
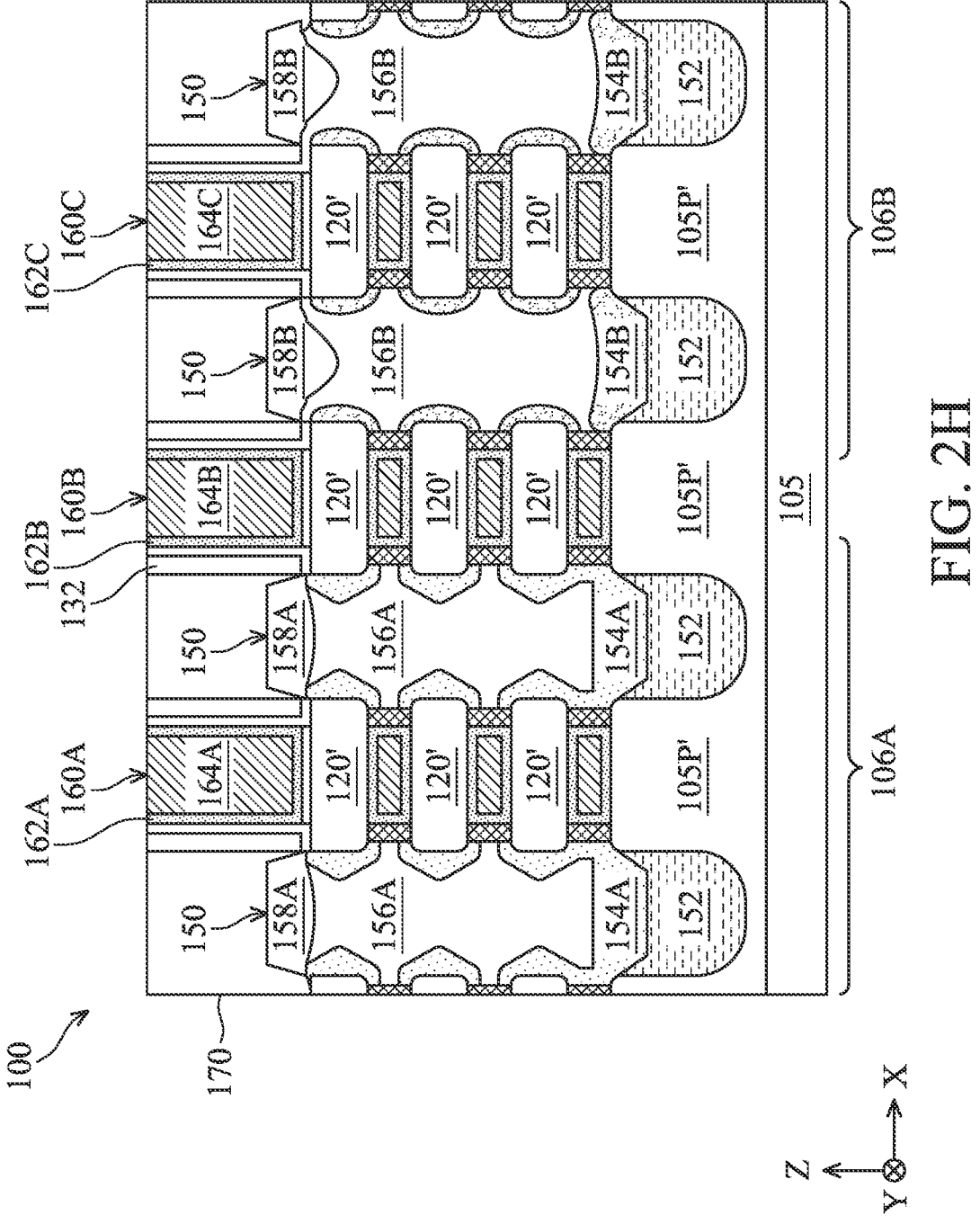
Figure 3B:
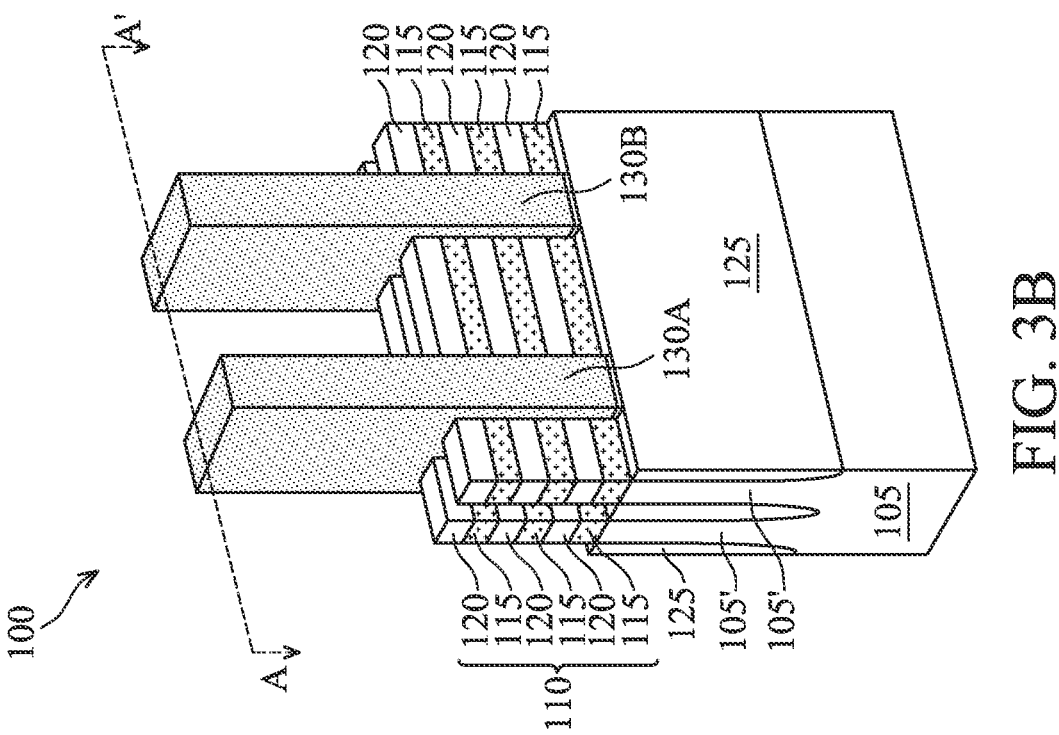
FIGS. 3A-3I are fragmentary perspective views of a multigate device having enhanced epitaxial source/drain structures, in portion or entirety, at various fabrication stages associated with the method in FIG. 1 according to various aspects of the present disclosure.
Figure 3A:
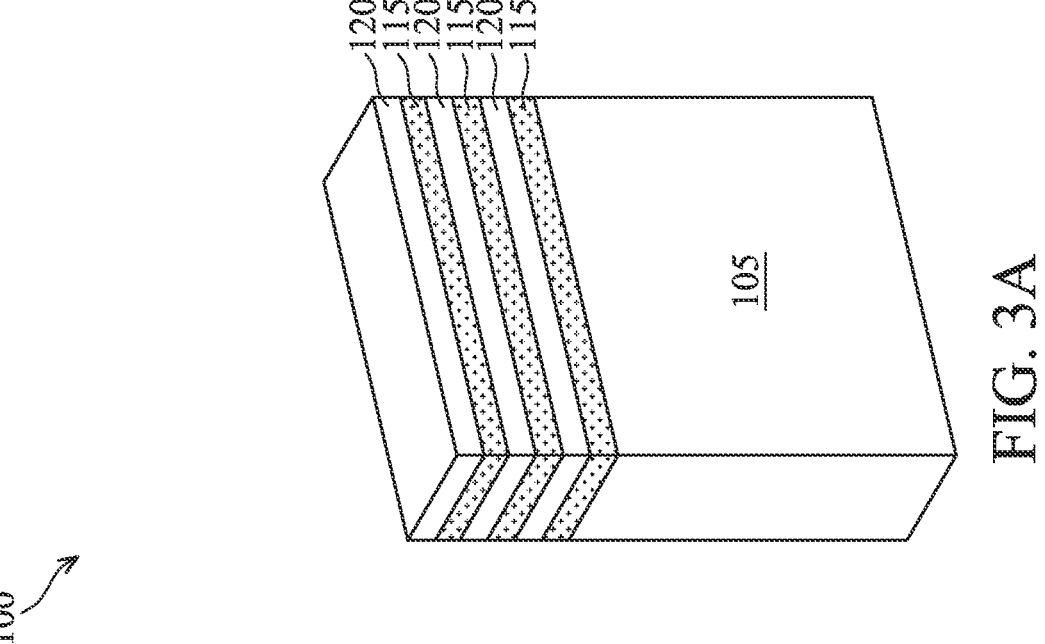
Figure 3D:
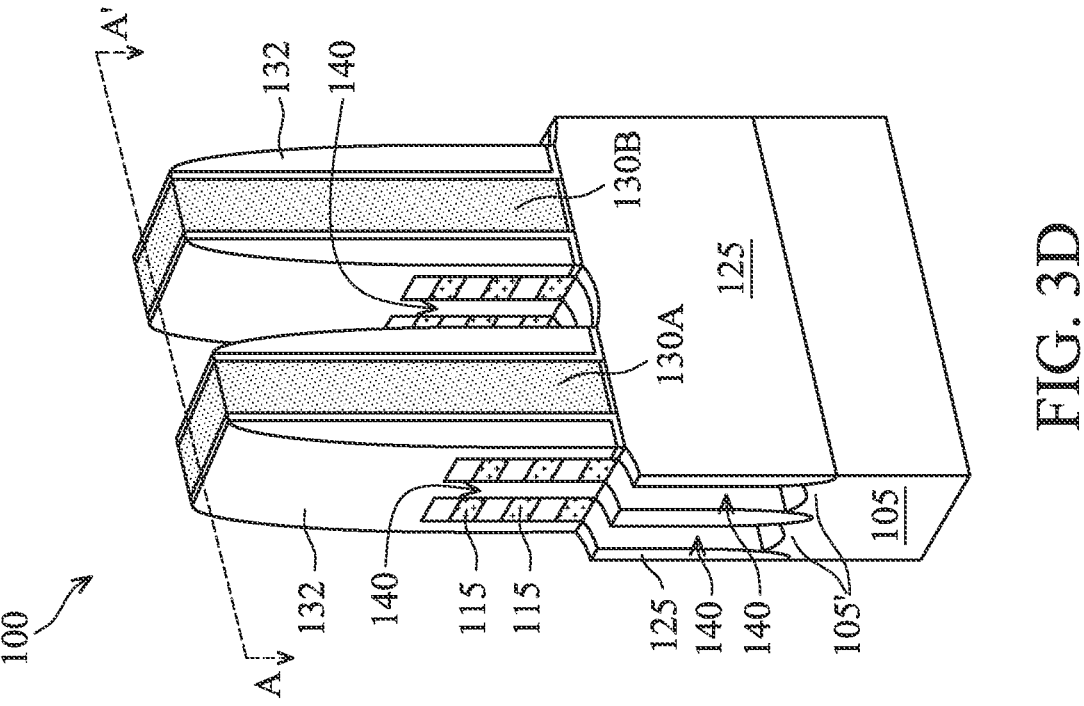
Figure 3C:
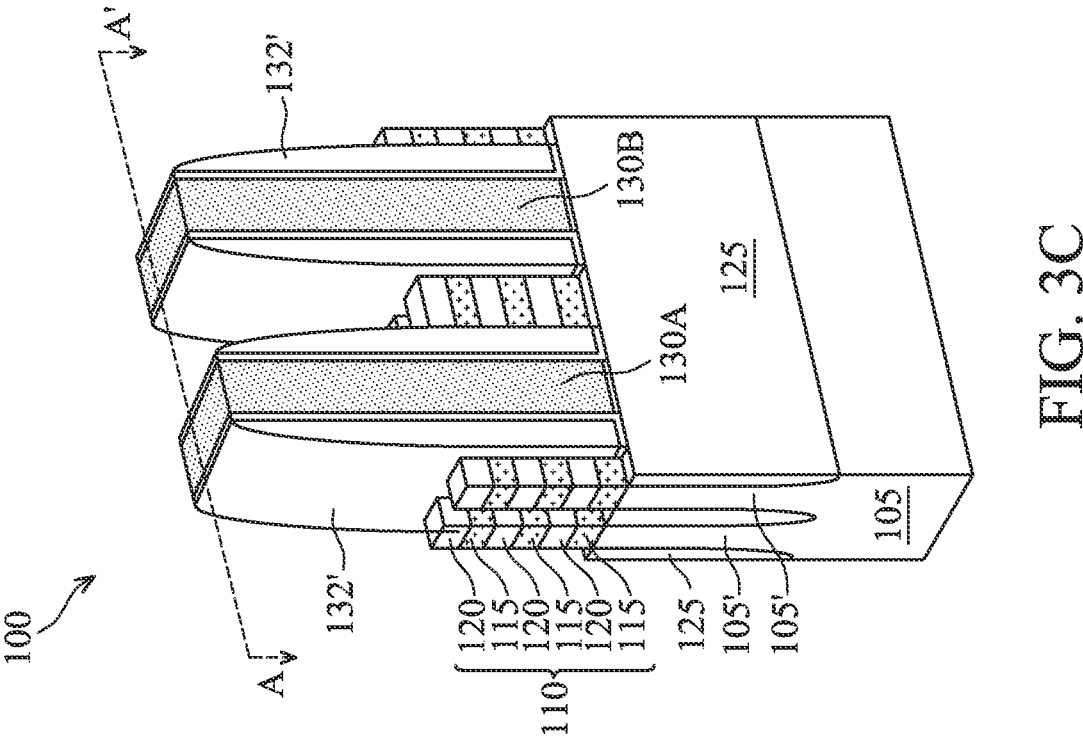
Figure 3F:
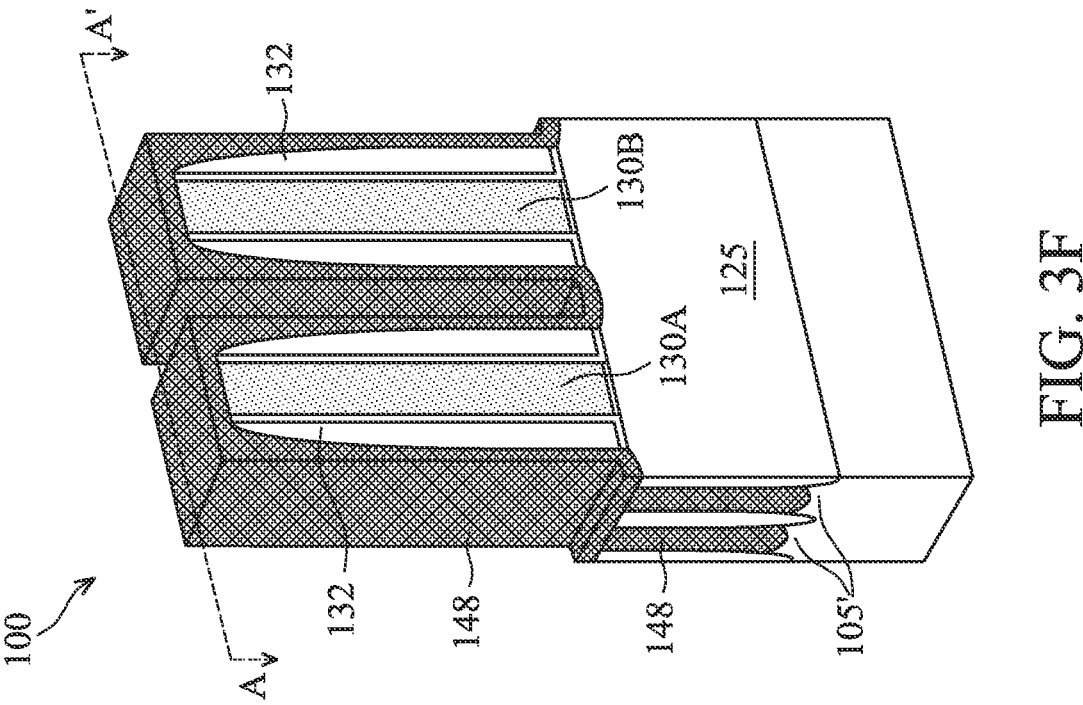
Figure 3E:
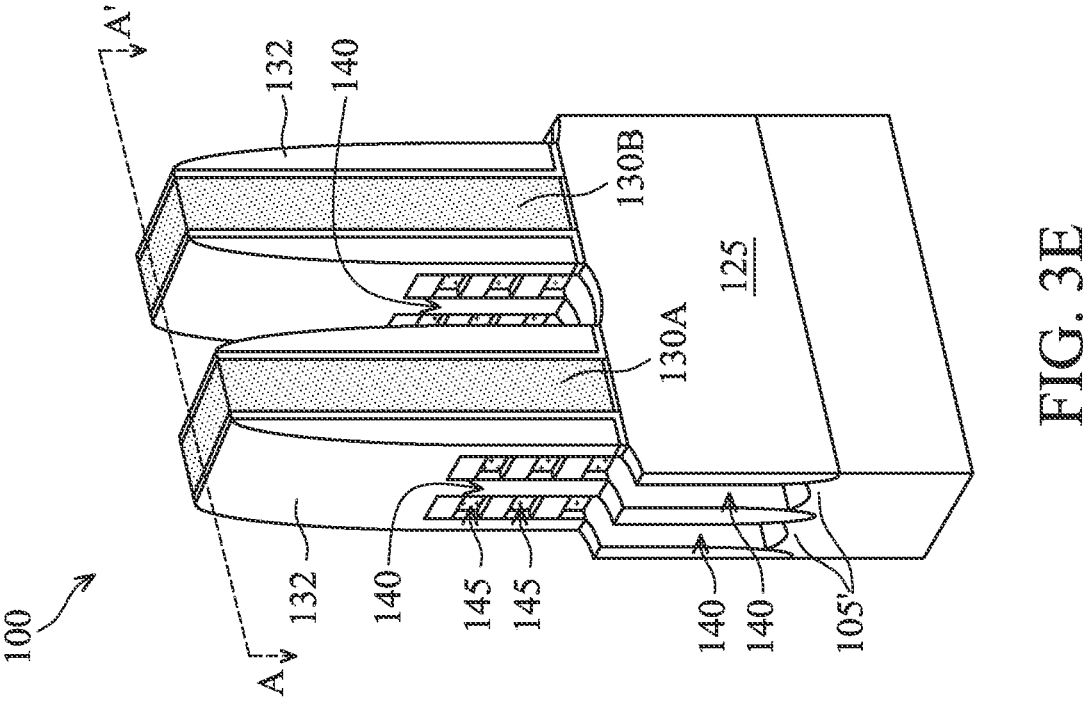
Figure 3H:
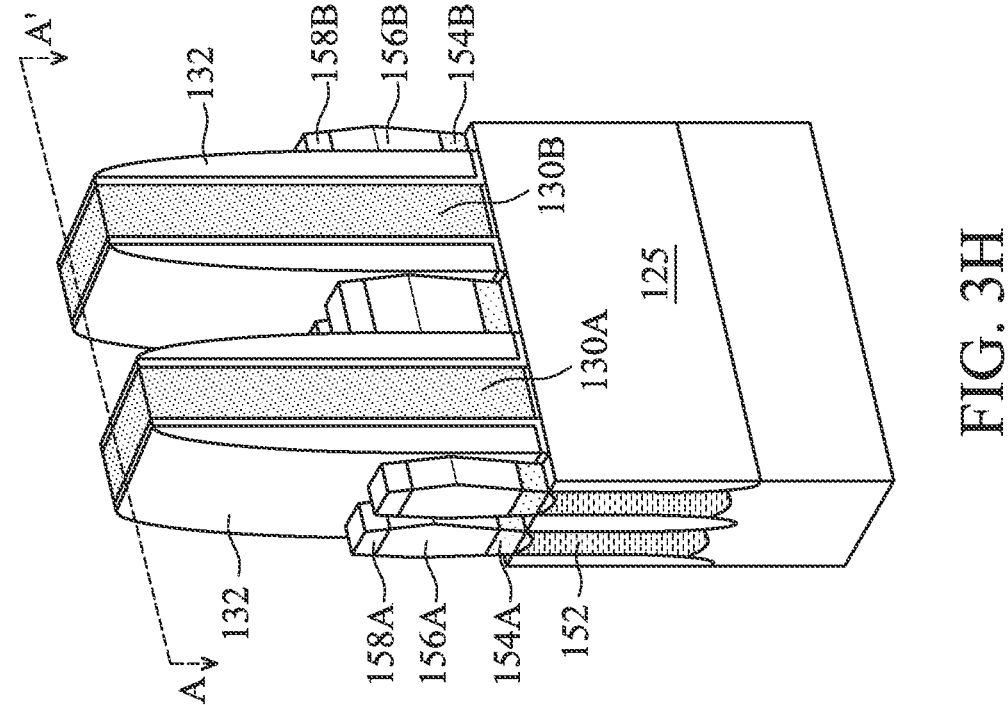
Figure 3G:
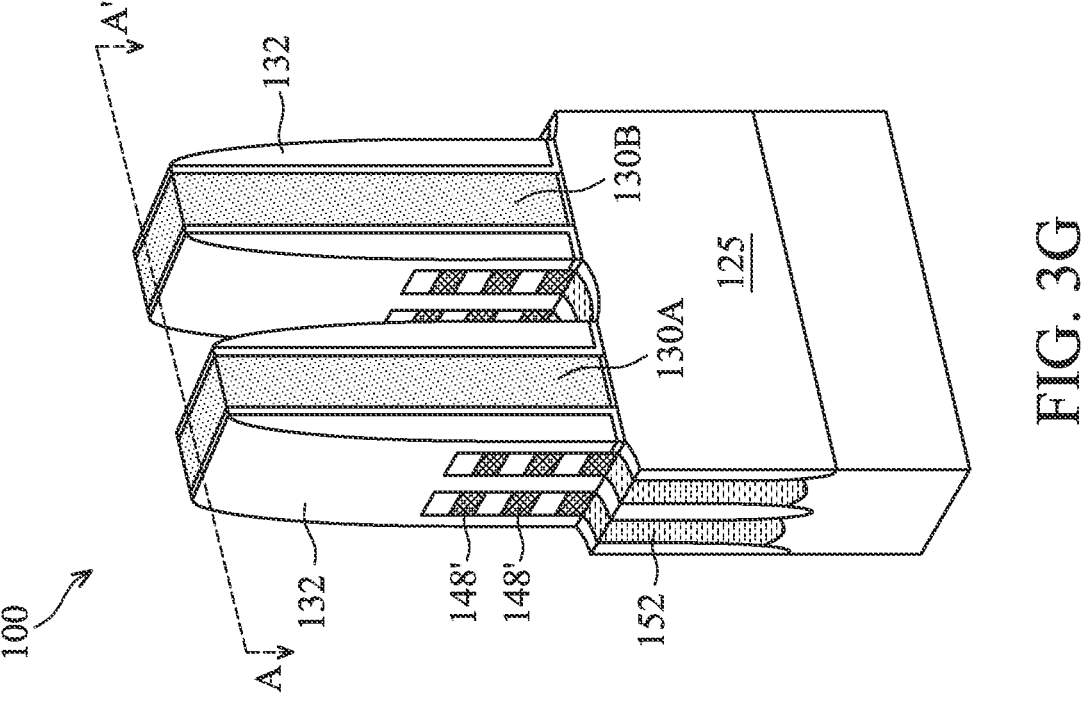
Figure 3I:
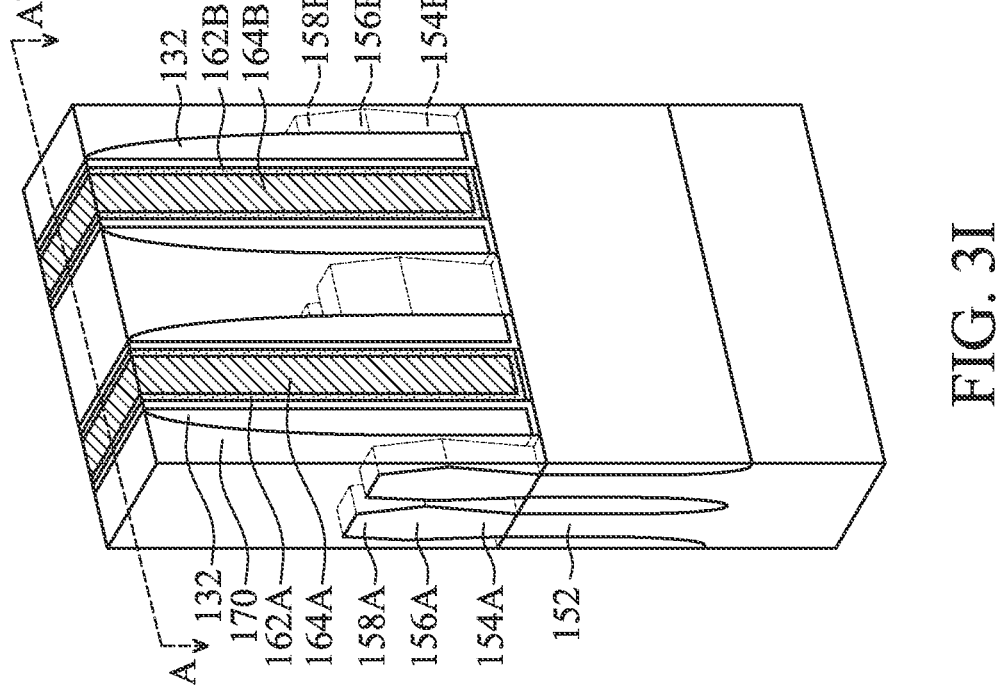
Figure 4A:
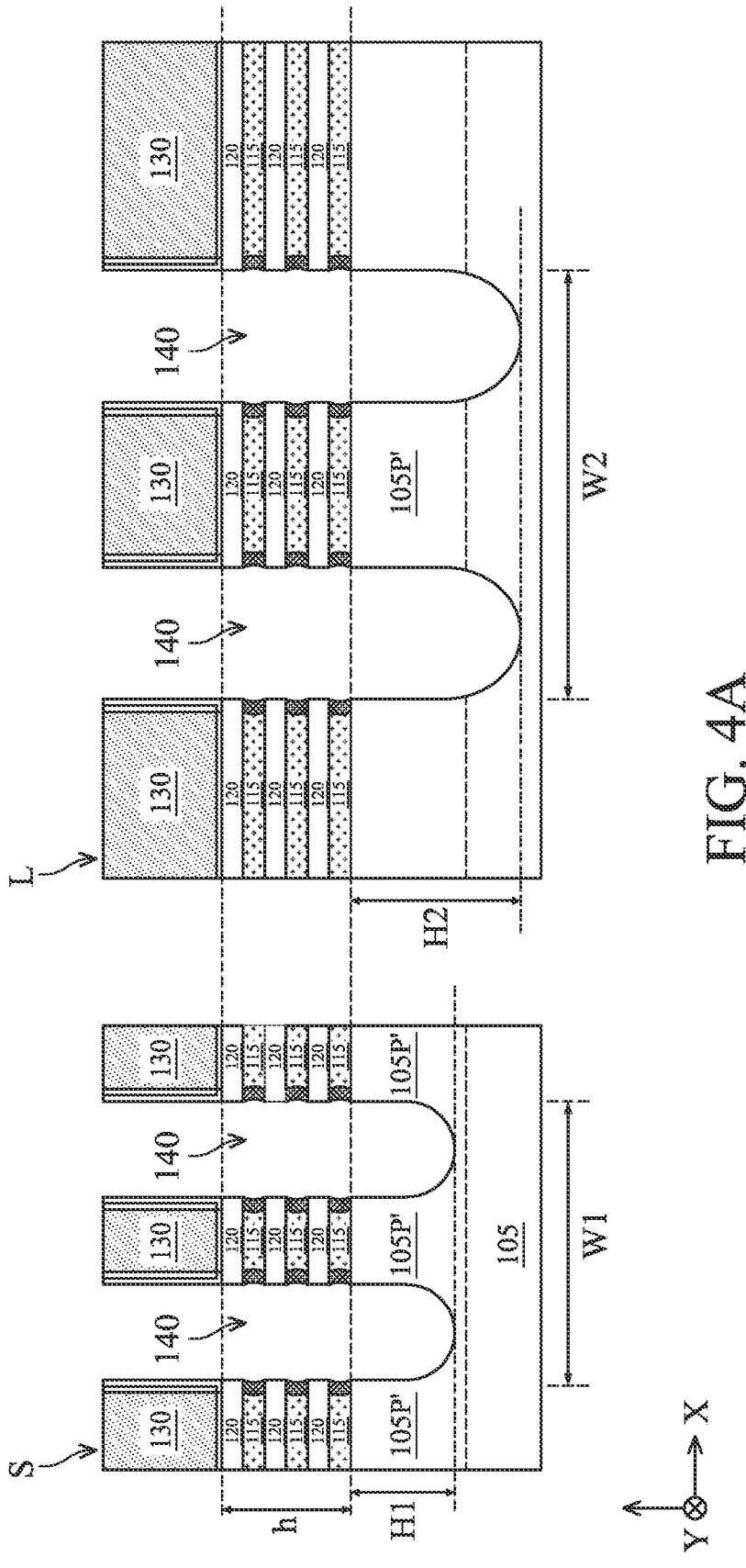
FIGS. 4A-4C are fragmentary cross-sectional views of multigate devices having different active region sizes, in portion or entirety, at various fabrication stages associated with the method in FIG. 1 according to various aspects of the present disclosure.
Figure 4B:
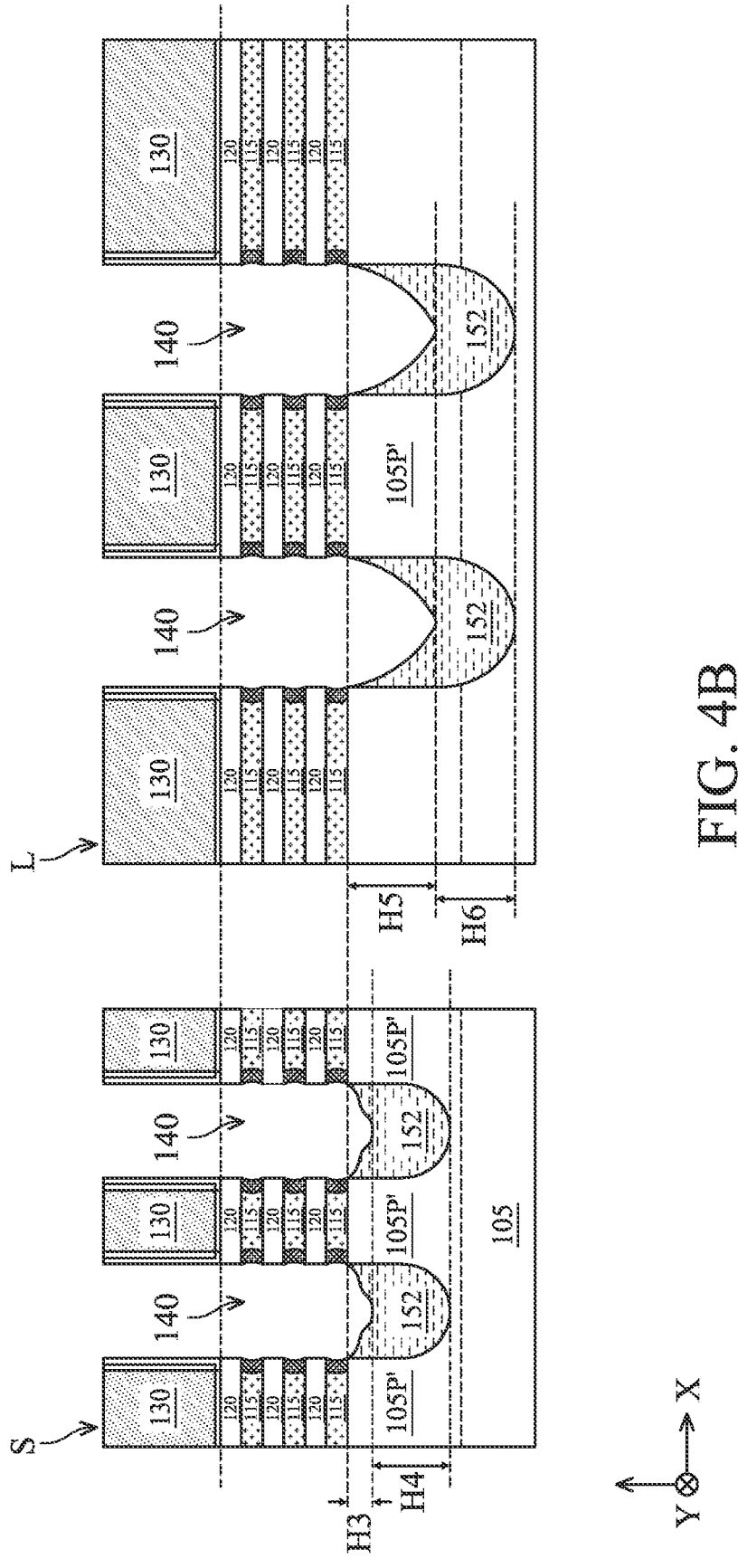
Figure 4C:
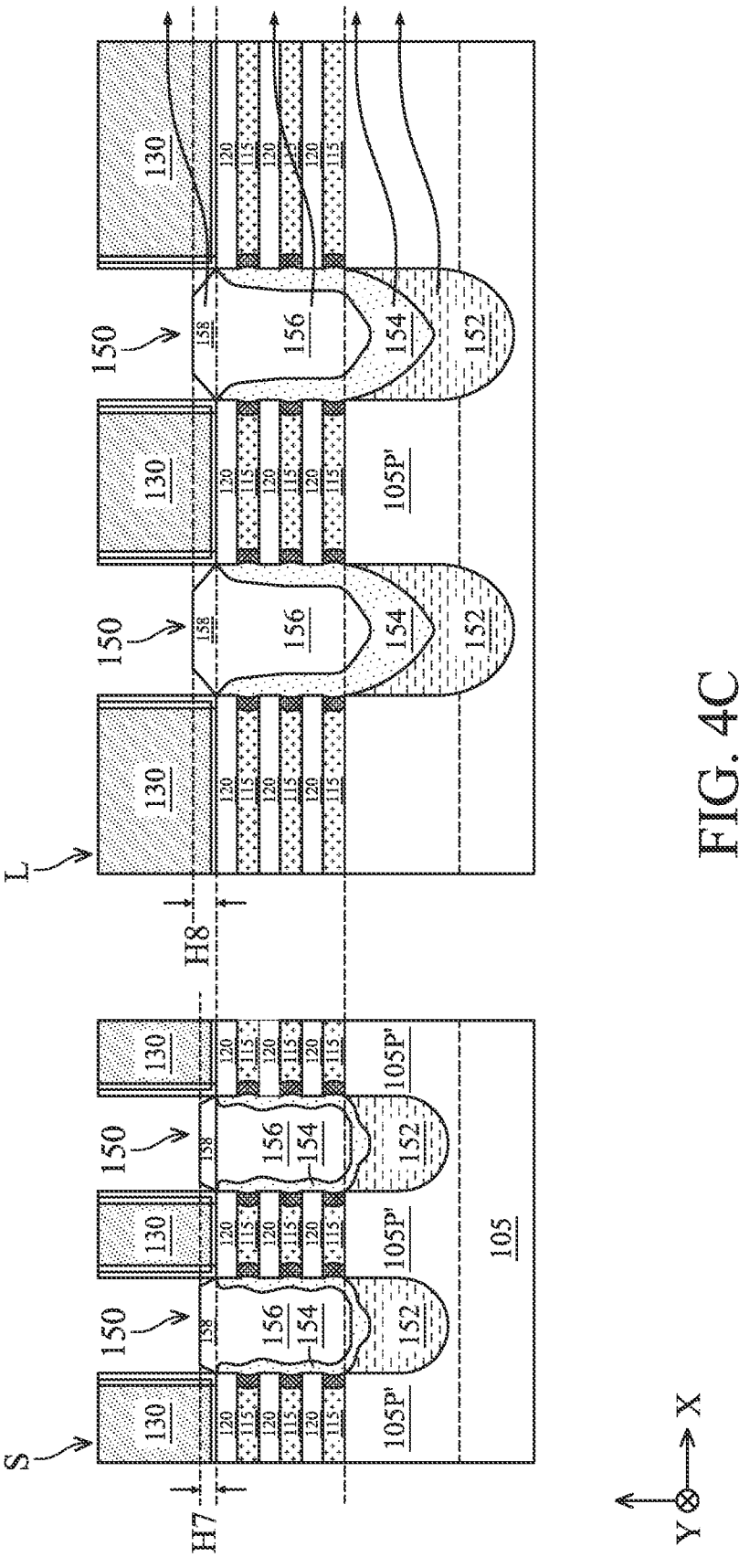

FIG. 1 is a flow chart of a method 10 for fabricating a multigate device having enhanced epitaxial source/drain structures according to various aspects of the present disclosure. FIGS. 2A-2H are fragmentary cross-sectional views of a multigate device 100 having enhanced epitaxial source/drain structures, in portion or entirety, at various fabrication stages associated with method 10 in FIG. 1 according to various aspects of the present disclosure. FIGS. 3A-3I are fragmentary perspective views of a portion of multigate device 100, in portion or entirety, at various fabrication stages associated with the method in FIG. 1 according to various aspects of the present disclosure. FIG. 3A and FIG. 3B correspond with the fabrication stage at FIG. 2A (where FIG. 2A is taken along line A-A' of FIG. 3B), FIG. 3C corresponds with the fabrication stage at FIG. 2B (where FIG. 2B is taken along line A-A' of FIG. 3C), FIG. 3D corresponds with the fabrication stage at FIG. 2C (where FIG. 2C is taken along line A-A' of FIG. 3D), FIG. 3E corresponds with the fabrication stage at FIG. 2D (where FIG. 2D is taken along line A-A' of FIG. 3E), FIG. 3F corresponds with the fabrication stage at FIG. 2E (where FIG. 2E is taken along line A-A' of FIG. 3F), FIG. 3G corresponds with the fabrication stage at FIG. 2F (where FIG. 2F is taken along line A-A' of FIG. 3G), FIG. 3H corresponds with the fabrication stage at FIG. 2G (where FIG. 2G is taken along line A-A' of FIG. 3H), and FIG. 3I corresponds with the fabrication stage at FIG. 2H (where FIG. 2H is taken along line A-A' of FIG. 3I). FIGS. 4A-4C are fragmentary cross-sectional views of multigate devices having different active region sizes at various fabrication stages, such as those associated with the method in FIG. 1, according to various aspects of the present disclosure. In some embodiments, FIG. 4A corresponds with the fabrication stage at FIG. 2C, FIG. 4B corresponds with the fabrication stage at FIG. 2E, and FIG. 4C corresponds with the fabrication stage at FIG. 2G.

Multigate device 100 includes at least one GAA transistor (i.e., a transistor having a gate that surrounds at least one suspended channel (for example, nanowires, nanosheets, nanobars, etc.), where the at least one suspended channel extends between epitaxial source/drains). In some embodiments, multigate device 100 is configured with at least one p-type GAA transistor and at least one n-type GAA transistor. Multigate device 100 may be included in a microprocessor, a memory, and/or other IC device. In some embodiments, multigate device 100 is a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIG. 1, FIGS. 2A-2G, FIGS. 3A-3I, and FIGS. 4A-4C are discussed concurrently herein for ease of description and understanding. FIG. 1, FIGS. 2A-2G, FIGS. 3A-3I, and FIGS. 4A-4C have been simplified for the sake of clarity to better understand the inventive concepts of the present disclosure. Additional steps can be provided before, during, and after method 10, and some of the steps described can be moved, replaced, or eliminated for additional embodiments of method 10. Additional features can be added in multigate device 100, and some of the features described below can be replaced, modified, or eliminated in other embodiments of multigate device 100.

Turning to FIG. 1 and FIG. 2A (and corresponding FIG. 3A and FIG. 3B), method 10 begins with receiving a multigate device precursor for multigate device 100 at block 15. In FIG. 2A, multigate device 100 has undergone processing associated with FIG. 3A and FIG. 3B, and the multigate device precursor includes a semiconductor substrate (wafer) 105, a semiconductor layer stack 110 (having semiconductor layers 115, semiconductor layers 120, and a fin portion 105' of semiconductor substrate 105 (i.e., a patterned, projecting portion of semiconductor substrate 105), isolation features 125, and dummy gates 130A-130C (generally referred to as dummy gates 130). For example, semiconductor layer stack 110 is formed by depositing semiconductor layers 115 and semiconductor layers 120 over substrate 105 as depicted in FIG. 3A and patterning semiconductor layers 115, semiconductor layers 120, and substrate 105 to form semiconductor layer stack 110 extending from substrate 105 as depicted in FIG. 3B. Substrate 105 includes an elementary semiconductor, such as silicon and/or germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In the depicted embodiment, substrate 105 includes silicon. Substrate 105 (including fin portion 105') can include various doped regions, such as p-type doped regions (referred to as p-wells), n-type doped regions (referred to as n-wells), or combinations thereof. In some embodiments, fin portion 105' includes a p-well, such as where n-type transistors are formed in a transistor region 106A, and an n-well, such as where p-type transistors are formed in a transistor region 106B, or vice versa. N-wells include n-type dopants, such as phosphorus, arsenic, other n-type dopant, or combinations thereof. P-wells include p-type dopants, such as boron, indium, other p-type dopant, or combinations thereof. In some embodiments, doped regions in substrate 105 (and fin portion 105') include a combination of p-type dopants and n-type dopants. The various doped regions can be formed directly on and/or in substrate 105 (and fin portion 105'), for example, providing a p-well structure, an n-well structure, a dual-well structure, a raised structure, or combinations thereof. An ion implantation process, a diffusion process, and/or other suitable doping process can be performed to form the various doped regions.

In FIG. 3A, semiconductor layers 115 and semiconductor layers 120 are stacked vertically (e.g., along the z-direction) in an interleaving or alternating configuration from a top surface of substrate 105. In some embodiments, the depositing includes epitaxially growing semiconductor layers 115 and semiconductor layers 120 in the depicted interleaving and alternating configuration. For example, a first one of semiconductor layers 115 is epitaxially grown on substrate 105, a first one of semiconductor layers 120 is epitaxially grown on the first one of semiconductor layers 115, a second one of semiconductor layers 115 is epitaxially grown on the first one of semiconductor layers 120, and so on until semiconductor layer stack 110 has a desired number of semiconductor layers 115 and semiconductor layers 120. In such embodiments, semiconductor layers 115 and semiconductor layers 120 can be referred to as epitaxial layers. In some embodiments, epitaxial growth of semiconductor layers 115 and semiconductor layers 120 is achieved by a molecular beam epitaxy (MBE) process, a chemical vapor deposition (CVD) process, a metalorganic (MOCVD) process, other suitable epitaxial growth process, or combinations thereof. A composition of semiconductor layers 115 is different than a composition of semiconductor layers 120 to achieve different etching selectivity and/or different oxidation rates during subsequent processing. Semiconductor layers 115 and semiconductor layers 120 include different materials, constituent atomic percentages, constituent weight percentages, thicknesses, and/or characteristics to achieve desired etching selectivity during an etching process, such as an etching process implemented to form suspended channel layers in channel regions of a multigate device. For example, where semiconductor layers 115 include silicon germanium and semiconductor layers 120 include silicon, a silicon etch rate of semiconductor layers 120 is less than a silicon germanium etch rate of semiconductor layers 115 to a given etchant. In some embodiments, semiconductor layers 115 and semiconductor layers 120 include the same material but with different constituent atomic percentages to achieve the etching selectivity and/or different oxidation rates. For example, semiconductor layers 115 and semiconductor layers 120 can include silicon germanium, where semiconductor layers 115 and semiconductor layers 120 have different silicon atomic percentages and/or different germanium atomic percentages. Semiconductor layers 115 and semiconductor layers 120 include any combination of semiconductor materials that provides desired etching selectivity, desired oxidation rate differences, and/or desired performance characteristics (e.g., materials that maximize current flow), including any of the semiconductor materials disclosed herein.

In FIG. 2A and FIG. 3B, after patterning, semiconductor layer stack 110 includes fin portion 105' of substrate 105 (also referred to as a substrate extension, a substrate fin portion, a fin portion, an etched substrate portion, etc.) and a semiconductor layer stack portion (i.e., a portion of semiconductor layer stack 110 that includes semiconductor layers 115 and semiconductor layers 120) disposed over fin portion 105'. Semiconductor layer stack 110 extends sub- stantially along the x-direction, having a length along the x-direction, a width along a y-direction, and a height along a z-direction. In some embodiments, a lithography and/or etching process is performed to pattern semiconductor layers 115, semiconductor layers 120, and substrate 105 to form semiconductor layer stack 110. The lithography process can include forming a resist layer (for example, by spin coating), performing a pre-exposure baking process, performing an exposure process using a mask, performing a post-exposure baking process, and performing a developing process. Dur- ing the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the devel- oping process depending on characteristics of the resist layer and characteristics of a developing solution used in the developing process. After development, the patterned resist layer includes a resist pattern that corresponds with the mask. The etching process removes portions of semicon- ductor layers 120, semiconductor layers 115, and substrate 105 using the patterned resist layer as an etch mask. In some embodiments, the patterned resist layer is formed over a mask layer disposed over semiconductor layer stack 110, a first etching process removes portions of the mask layer to form a patterning layer (i.e., a patterned hard mask layer), and a second etching process removes portions of semicon- ductor layer stack 110 using the patterning layer as an etch mask. The etching process can include a dry etching, a wet etching, other suitable etching process, or combinations thereof. In some embodiments, the etching process is a reactive ion etching (RIE) process. After the etching process, the patterned resist layer is removed, for example, by a resist stripping process or other suitable process. Alternatively, semiconductor layer stack 110 is formed by a multiple patterning process, such as a double patterning lithography (DPL) process (for example, a lithography-etch-lithogra- phy-etch (LELE) process, a self-aligned double patterning (SADP) process, a spacer-is-dielectric (SID) process, other double patterning process, or combinations thereof), a triple patterning process (for example, a lithography-etch-lithog- raphy-etch-lithography-etch (LELELE) process, a self- aligned triple patterning (SATP) process, other triple pat- terning process, or combinations thereof), other multiple patterning process (for example, self-aligned quadruple pat- terning (SAQP) process), or combinations thereof. In some embodiments, directed self-assembly (DSA) techniques are implemented while forming semiconductor layer stack 110. Further, in some embodiments, the exposure process can implement maskless lithography, electron-beam (e-beam) writing, and/or ion-beam writing for patterning the resist layer. In some embodiments, semiconductor layer stack 110 is formed by a fin fabrication process and semiconductor layer stack 110 can be referred to as a fin, a fin structure, a fin element, an active fin region, an active region, etc.

In some embodiments, after patterning, a trench surrounds semiconductor layer stack 110, such that semiconductor layer stack 110 is separated from other active regions of multigate device 100. In such embodiments (e.g., FIG. 3B), isolation features 125 can be formed in the trench by depositing an insulator material (e.g., using a CVD process or a spin-on glass process) over substrate 105 that fills the trench and performing a chemical mechanical polishing (CMP) process to remove excessive insulator material and/ or planarize top surfaces of isolation features 125. The deposition process may be a flowable CVD (FCVD) pro- cess, a high aspect ratio deposition (HARP) process, a high-density plasma CVD (HDPCVD) process, other suit- able deposition process, or combinations thereof. In some embodiments, the CMP process removes insulator material over top surfaces of semiconductor layer stack 110. In some embodiments, the insulator material is etched back, such that a portion of semiconductor layer stack 110 extends from isolation features 125 (i.e., a top surface of semiconductor layer stack 110 is higher than top surfaces of isolation features 125). In some embodiments, isolation features 125 have a multi-layer structure, such as an oxide layer disposed over a silicon nitride liner. In some embodiments, isolation features 125 include a dielectric layer disposed over a doped liner (including, for example, boron silicate glass (BSG) or phosphosilicate glass (PSG)). In some embodiments, isola- tion features 125 include a bulk dielectric layer disposed over a dielectric liner. Isolation features 125 include silicon oxide, silicon nitride, silicon oxynitride, other suitable iso- lation material (for example, including silicon, oxygen, nitrogen, carbon, or other suitable isolation constituent), or combinations thereof. Isolation features 125 can be config- ured as shallow trench isolation (STI) structures, deep trench isolation (DTI) structures, local oxidation of silicon (LO- COS) structures, and/or other suitable isolation structures.

In FIG. 2A and FIG. 3B, dummy gates 130A-130C are formed over channel regions of semiconductor layer stack 110, such that dummy gates 130A-130C are disposed between source/drain regions of semiconductor layer stack 110. Dummy gates 130A-130C extend lengthwise in a direction that is different than (e.g., orthogonal to) the lengthwise direction of semiconductor layer stack 110. For example, dummy gates 130A-130C extend substantially parallel to one another along the y-direction, having a length along the y-direction, a width along the x-direction, and a height along the z-direction. In the X-Z plane (FIG. 2A), such as depicted, dummy gates 130A-130C are disposed on a top surface of semiconductor layer stack 110. In the Y-Z plane (FIG. 3B), dummy gates 130A-130C may be disposed over the top surface and sidewall surfaces of semiconductor layer stack 110, such that dummy gates 130A-130C wrap semiconductor layer stack 110. Dummy gates 130A-130C each include a dummy gate dielectric, a dummy gate elec- trode, and a hard mask. The dummy gate dielectric includes a dielectric material. In some embodiments, the dummy gate dielectric includes an interfacial layer (including, for example, silicon oxide) and a dielectric layer disposed over the interfacial layer. The dummy gate electrode includes a suitable dummy gate material, and the hard mask includes a suitable hard mask material. In some embodiments, the dummy gate electrode includes a polysilicon layer, and the hard mask includes a silicon nitride layer. Dummy gates 130A-130C can include other layers, such as capping layers, interface layers, diffusion layers, barrier layers, or combinations thereof.

Dummy gates 130A-130C are formed by deposition processes, lithography processes, etching processes, other suitable processes, or combinations thereof. For example, a first deposition process is performed to form a dummy gate dielectric layer over multigate device 100, a second deposition process is performed to form a dummy gate electrode layer over the dummy gate dielectric layer, and a third deposition process is performed to form a hard mask layer over the dummy gate electrode layer. The deposition processes include CVD, physical vapor deposition (PVD), atomic layer deposition (ALD), MOCVD, remote plasma CVD (RPCVD), plasma enhanced CVD (PECVD), HDPCVD, FCVD, HARP, low-pressure CVD (LPCVD), atomic layer CVD (ALCVD), atmospheric pressure CVD (APCVD), sub-atmospheric CVD (SACVD), other suitable deposition processes, or combinations thereof. A lithography patterning and etching process is then performed to pattern the hard mask layer, the dummy gate electrode layer, and the dummy gate dielectric layer to form dummy gates 130A-130C, which include the dummy gate dielectric, the dummy gate electrode, and the hard mask. The lithography patterning process can include resist coating (for example, spin-on coating), soft baking, mask aligning, exposure, post-exposure baking, developing the resist, rinsing, drying (for example, hard baking), other suitable process, or combinations thereof. The etching process can include a dry etching, a wet etching, other etching process, or combinations thereof.

Turning to FIG. 2B (and corresponding FIG. 3C) and FIG. 2C (and corresponding FIG. 3D), gate spacers 132 are formed adjacent to (i.e., along sidewalls of) dummy gates 130A-130C (FIG. 2B (FIG. 3C) and FIG. 2C (FIG. 3D)) and source/drain recesses (trenches) 140 are formed in source/drain regions of semiconductor layer stack 110 (FIG. 2C (FIG. 3D)). In FIG. 2B (FIG. 3C), a spacer layer 132' is formed over multigate device 100. For example, a dielectric layer is formed over semiconductor layer stack 110, isolation features 125, and dummy gates 130A-130C by a deposition process, such as CVD, PECVD, ALD, PEALD, PVD, other suitable deposition process, or combinations thereof. The dielectric material can include silicon, oxygen, carbon, nitrogen, other suitable spacer constituent, or combinations thereof (for example, silicon oxide, silicon nitride, silicon oxynitride, silicon carbide, silicon carbonitride, silicon oxycarbide, silicon oxycarbonitride, silicon boron carbonitride, etc.). In some embodiments, spacer layer 132' is a single layer, such as one dielectric layer that includes silicon and nitrogen (which may be referred to as a silicon nitride layer). In some embodiments, spacer layer 132' includes multiple layers, such as a first dielectric layer (e.g., a silicon carbonitride layer) formed by a first deposition process and a second dielectric layer (e.g., a silicon nitride layer) formed by a second deposition process over the first dielectric layer. In some embodiments, spacer layer 132' has a substantially uniform thickness along top surfaces and sidewalls of dummy gates 130A-130C and semiconductor layer stack 110. For example, a thickness of spacer layer 132' along a top surface of semiconductor layer stack 110, top surfaces of dummy gates 130A-130C, sidewalls of semiconductor layer stack 110, and sidewalls of dummy gates 130A-130C is substantially the same. In some embodiments, spacer layer 132' is formed by a conformal deposition process, such that spacer layer 132' conforms to surfaces of multigate device

100 upon which spacer layer 132' is deposited (and may thus be referred to as a conformal spacer layer).

In FIG. 2C (FIG. 3D), processing proceeds with performing a spacer etch on spacer layer 132' to form gate spacers 132 along sidewalls of dummy gates 130A-130C and a source/drain etch (for example, at block 20 of method 10) to form source/drain recesses 140 in source/drain regions of semiconductor layer stack 110 in transistor region 106A and transistor region 106B, respectively. The spacer etch substantially removes spacer layer 132' from horizontal (lateral) surfaces of multigate device 100, such as top surfaces of semiconductor layer stack 110, top surfaces of isolation features 125, and top surfaces of dummy gates 130A-130C, thereby forming respective gate spacers 132 along sidewalls of dummy gates 130A-130C. In some embodiments, the spacer etch may remove portions of semiconductor layer stack 110, thereby beginning formation of source/drain recesses 140 in semiconductor layer stack 110. In some embodiments, the spacer etch selectively removes spacer layer 132' with respect to dummy gates 130A-130C, isolation features 125, and/or semiconductor layer stack 110. In other words, the spacer etch substantially removes spacer layer 132' but does not remove, or does not substantially remove, dummy gates 130A-130C, isolation features 125, and/or semiconductor layer stack 110. In some embodiments, gate spacers 132 include more than one set of spacers, such as seal spacers, offset spacers, sacrificial spacers, dummy spacers, and/or main spacers. For example, where spacer layer 132' includes a first dielectric layer and a second dielectric layer, gate spacers 132 can include spacer liners (e.g., L-shaped liners) formed from the first dielectric layer and main spacers formed from the second dielectric layer. Implantation, diffusion, and/or annealing processes may be performed to form lightly doped source and drain (LDD) features and/or heavily doped source and drain (HDD) features in source/drain regions of semiconductor layer stack 110 before and/or after forming gate spacers 132.

The source/drain etch removes exposed portions of semiconductor layer stack 110 (i.e., source/drain regions of semiconductor layer stack 110 that are not covered by dummy gates 130A-130C and gate spacers 132) to form source/drain recesses 140 that extend through semiconductor layer stack 110 to a depth in substrate 105 (e.g., a depth in fin portion 105'). In FIG. 2C, an etching process completely removes semiconductor layers 115 and semiconductor layers 120 in source/drain regions of semiconductor layer stack 110 and some, but not all, of fin portion 105' in source/drain regions of semiconductor layer stack 110, such that source/drain recesses 140 extend into but not through fin portion 105'. When source/drain recesses 140 extend into fin portion 105' and/or substrate 105, such as depicted, channel regions of semiconductor layer stack 110 have projecting portions (which are referred to as semiconductor mesas 105P' hereafter) formed from fin portion 105' and/or substrate 105 in the X-Z plane and source/drain regions of the semiconductor layer stack 110 have recessed portions formed from fin portion 105' and/or substrate 105 in the X-Z plane. Source/drain recesses 140 are thus formed by sidewalls of adjacent channel regions of semiconductor layer stack 110 and tops of remaining, recessed portions of fin portion 105' and/or substrate 105 in source/drain regions of semiconductor layer stack 110. In some embodiments, source/drain recesses 140 have U-shaped cross-sectional profiles, where substantially linear, sidewall, and/or vertical sections of the U-shaped cross-sectional profiles are formed by adjacent channel regions of semiconductor layer stack 110 and substantially curvilinear, bottom, and/or horizontal sections of the U-shaped cross-sectional profiles are formed by fin portion 105' and/or substrate 105 (e.g., adjacent semiconductor mesas 105P' in channel regions of semiconductor layer stack 110 and remaining, recessed portions of fin portion 105' and/or substrate 105 in source/drain regions of semiconductor layer stack 110 that extend between adjacent semiconductor mesas 105P').

Source/drain recesses 140 have a width W along the x-direction between sidewalls of adjacent channel regions of semiconductor layer stack 110 and a depth D along the z-direction between a top surface of semiconductor layer stack 110 and bottommost portions of source/drain recesses 140. Depth D is a sum of a height h of semiconductor layer stack 110 and a depth d of source/drain recesses 140 into substrate 105. Depth d corresponds with a height of semiconductor mesas 105P', where the height is between top surfaces of semiconductor mesas 105P' and bottommost portions of source/drain recesses 140. In embodiments where depth d is less than fin portion 105', semiconductor mesas 105P' are formed by fin portion 105'. In embodiments where depth d is less than fin portion 105', semiconductor mesas 105P' are formed by fin portion 105' and substrate 105. In some embodiments, depth d is about 20 nm to about 100 nm. Height h may be configured to optimize performance and/or fabrication of a multigate device. For example, after the source/drain etch, remaining portions of semiconductor layer stack 110 (i.e., channel regions) have fin-like structures that are susceptible to bending and/or collapse if the fin-like structures are too tall, which can impact fabrication reliability and/or device reliability. On the other hand, since taller fin-like structures facilitate higher drive current, fin-like structures that are too short may not provide a multigate device with desired performance characteristics. For example, shorter fin-line structures will have fewer semiconductor layers and thus limit a number of channels of the multigate device, which correspondingly limits drive current of the multigate device. In the depicted embodiment, height h is about 30 nm to about 80 nm, where height h greater than about 80 nm can induce undesired bending and/or collapse of remaining portions of semiconductor layer stack 110 and height h less than about 30 nm will not provide a multigate device fabricated from semiconductor layer stack 110 with sufficiently high drive current and/or other optimal performance characteristic.

The source/drain etch includes a dry etching, a wet etching, other suitable etching process, or combinations thereof. Various etching parameters can be tuned to selectively etch semiconductor layer stack 110 (i.e., semiconductor layers 120, semiconductor layers 115, and fin portion 105') with minimal (to no) etching of dummy gates 130A-130C, gate spacers 132, and/or isolation features 125, such as etch gas composition, carrier gas composition, etch gas flow rate, carrier gas flow rate, etch time, etch pressure, etch temperature, source power, radio frequency (RF) bias voltage, direct current (DC) bias voltage, RF bias power, DC bias power, other suitable etch parameters, or combinations thereof. For example, an etchant is selected for the source/drain etch that can remove the material of semiconductor layer stack 110 (e.g., semiconductor materials, such as silicon germanium and silicon) at a higher rate than the material of dummy gates 130A-130C and/or gate spacers 132 (e.g., dielectric material, such as silicon oxide, and/or polysilicon material) (i.e., the etchant has a high etch selectivity with respect to the material of semiconductor layer stack 110). In some embodiments, an etch gas of the source/drain etch includes $CH_4$, $CHF_3$, $O_2$, HBr, $SiCl_4$, $SO_2$, $SF_6$, He, $H_2$, other suitable etch gas constituents, or combinations thereof. In some embodiments, the source/drain etch is a dry etching that implements a fluorine-containing etch gas (e.g., $CHF_3$ and/or $SF_6$) and an oxygen-containing etch gas (e.g., $O_2$). In some embodiments, the source/drain etch implements an etch temperature of about 25° C. to about 152° C. In some embodiments, the source/drain etch implements an etch pressure of about 5 millitorr (mTorr) to about 100 mTorr. In some embodiments, the source/drain etch is a multi-step etch process. For example, the source/drain etch may alternate etchants to separately and alternately remove semiconductor layers 115 and semiconductor layers 120. In some embodiments, a lithography process, such as those described herein, is performed to form a patterned mask layer that covers dummy gates 130A-130C and/or isolation features 125, and the source/drain etch uses the patterned mask layer as an etch mask. In some embodiments, the source/drain etch removes all of fin portion 105' in source/drain regions of semiconductor layer stack 110, such that source/drain recesses 140 extend to or below bottommost surfaces of isolation features 125. In some embodiments, the spacer etch and the source/drain etch are a single etch process. In some embodiments, the spacer etch and the source/drain etch are separate, sequential etch processes.

Short channel effects (SCEs) impact reliability and predictability of transistor performance, such as threshold voltage, leakage current, current-voltage behavior, and/or other performance characteristics. Since SCEs are highly dependent on channel length and small active region devices are thus more susceptible to SCEs than large active region devices, the epitaxial source/drain fabrication techniques described herein configure depth d relative to height h to minimize and/or mitigate SCEs depending on a size of an active region of a multigate device (which, for transistors, generally includes a channel region disposed between source/drain regions for purposes of the present disclosure). For example, turning to FIG. 4A, a multigate device S having a small active region and a multigate device L having a large active region are configured with different heights relative to height h to minimize SCEs as described further below. For purposes of the present disclosure, small active region device generally refers to active regions having a width W1 that is less than or equal to about 30 nm (and/or a channel length that is less than or equal to about 20 nm (i.e., length of semiconductor layers 120 along the x-direction)), and large active region refers to active regions having a width W2 that is greater than about 30 nm (and/or a channel length that is greater than about 20 nm (i.e., length of semiconductor layers 120 along the x-direction)). In some embodiments, multigate device S is a transistor of a memory, such as a static random-access memory (SRAM). In some embodiments, multigate device L is a transistor of an input/output (I/O) device. In some embodiments, multigate device S and/or multigate device L is a transistor of a ring oscillator (RO) device. The present disclosure contemplates multigate device S and/or multigate device L being a transistor of other types of integrated circuit (IC) devices.

In FIG. 4A, multigate device S (i.e., a small active region device) has semiconductor mesas 105P' having a height H1 that is less than height h (H1<h), and multigate device L (i.e., a large active region device) has semiconductor mesas 105P' having a height H2 that is greater than height h (i.e., H2>h). In other words, depth d of source/drain recesses 140 in multigate device S are less than depth d of source/drain recesses 140 in multigate device L, depth d of source/drain recesses 140 in multigate device S are less than height h, and depth d of source/drain recesses 140 in multigate device L are greater than height h. In some embodiments, height H1 is less than a thickness of fin portion 105', and height H2 is greater than a thickness of fin portion 105'. In some embodiments, a ratio of height h to height H1 (i.e., h/H1) is greater than 1, and a ratio of height h to height H2 (i.e., h/H2) is less than 1. For example, a ratio of height h to height H1 is about 1 to about 4 and/or a ratio of height h to height H2 is about 0.5 to about 0.9. In some embodiments, a difference between height h and height H1 (i.e., Δheight–S=|h–H1|) is about 5 nm to about 30 nm. In some embodiments, a difference between height h and height H2 (i.e., Δheight–L=|h–H2|) is about 10 nm to about 50 nm. In some embodiments, H1 is about 20 nm to about 30 nm, where H1 less than 20 nm may not provide a subsequently formed undoped epitaxial source/drain layer with a sufficient volume in substrate 105 to mitigate SCEs for small active region devices and H1 greater than 30 nm unnecessarily increases manufacturing/ production time and/or costs with minimal additional SCE mitigation for small active region devices. In some embodiments, H2 is about 35 nm to about 100 nm, where H2 less than 35 nm may not provide a subsequently formed undoped epitaxial source/drain layer with a sufficient volume in substrate 105 to mitigate SCEs for large active region devices and H2 greater than 100 nm unnecessarily increases manufacturing/production time and/or costs with minimal additional SCE mitigation for large active region devices.

Configuring small active region devices with shallower source/drain recesses 140 than large active region devices (e.g., H1<H2) recognizes that small active region devices and large active region devices have different susceptibilities to SCEs. For example, since SCEs may increase as depth d of source/drain recesses 140 increases (e.g., because source/ drain depth increases result in a depth and/or a volume of epitaxial source/drain structures in substrate 105 that increases), small active region devices (i.e., shorter channel lengths) may be more susceptible to SCEs as depth d of source/drain recesses 140 increases. However, since large active region devices (i.e., longer channel lengths) are less susceptible to SCEs than small active region devices, large active region devices are less susceptible to increases in depths of source/drain recesses. Configuring large active region devices with the same source/drain depths as small active region devices thus unnecessarily limits operational flexibility of large active region devices. For example, because source/drain depth affects a depth and/or a volume of epitaxial source/drain structures, shallower source/drain depths lead to smaller epitaxial source/drain structures and thus less strain imparted to channel regions, which can limit drive current of a transistor. Limiting source/drain depths of large active region devices to source/drain depths that optimize performance of small active region devices (e.g., by mitigating SCEs) thus limits performance improvements that can be achieved with larger epitaxial source/drain structures provided by deeper source/drain recesses despite large active device regions not being as susceptible to SCEs at such depths. Accordingly, the source/drain etch of the epitaxial source/drain fabrication techniques described herein is tuned to optimize source/drain profiles of source/ drain recesses 140 based on active region size (e.g., providing different source/drain depths and/or different height ratios for small active region devices and large active region devices to mitigate SCEs while optimizing performance). In some embodiments, the source/drain profiles can cause undoped epitaxial layers 152 formed at the same time to have different profiles based on active region size, where the different profiles can specifically enhance performance and/ or mitigate short channel effects of its corresponding sized active region.

In some embodiments, the source/drain etch is a cyclic lithography/etch process. For example, the source/drain etch can include performing a first lithography process to form a first masking layer that covers small active device regions (e.g., including multigate device S) and exposes large active device regions (e.g., including multigate device L); performing a first source/drain etch to form source/drain recesses having height H2 in source/drain regions of large active device regions, where height H2 is greater than height h; removing the first masking layer; performing a second lithography process to form a second masking layer that exposes small active device regions (e.g., including multigate device S) and covers large active device regions (e.g., including multigate device L); performing a second source/ drain etch to form source/drain recesses having height H1 in source/drain regions of small active device regions, where height H1 is less than height h; and removing the second masking layer.

Turning to FIGS. 2D-2F (and FIGS. 3E-3G corresponding therewith), inner spacers 148' are formed under gate spacers 132 between semiconductor layers 120 and along sidewalls of semiconductor layers 115. Inner spacers 148' separate semiconductor layers 120 from one another and separate bottommost semiconductor layers 120 from fin portion 105'. In FIG. 2D (FIG. 3E), an etching process is performed that selectively etches semiconductor layers 115 exposed by source/drain recesses 140 with minimal (to no) etching of semiconductor layers 120, fin portion 105', dummy gates 130A-130C, gate spacers 132, and/or isolation features 125. The etching process forms gaps 145 between semiconductor layers 120 and between fin portion 105' and semiconductor layers 120. Gaps 145 are disposed under gate spacers 132, such that semiconductor layers 120 are suspended under gate spacers 132 and separated from one another by gaps 145. In some embodiments, gaps 145 extend at least partially under dummy gates 130A-130C. The etching process is configured to laterally etch (e.g., along the x-direction and/or the y-direction) semiconductor layers 115. In the depicted embodiment, the etching process reduces a length of semiconductor layers 115 along the x-direction. The etching process is a dry etching, a wet etching, other suitable etching process, or combinations thereof.

In FIG. 2E (FIG. 3F), a deposition process then forms a spacer layer 148 over multigate device 100, including over features of multigate device 100 that form source/drain recesses 140 (e.g., semiconductor layers 115, semiconductor layers 120, and fin portion 105'), such as CVD, PVD, ALD, RPCVD, PECVD, HDPCVD, FCVD, HARP, LPCVD, ALCVD, APCVD, SACVD, MOCVD, plating, other suitable methods, or combinations thereof. Spacer layer 148 partially fills source/drain recesses 140. In the depicted embodiment, the deposition process is configured to ensure that spacer layer 148 fills gaps 145. In FIG. 2F (and FIG. 3F corresponding therewith), an inner spacer etch is then performed that selectively etches spacer layer 148 to form inner spacers 148', which fill gaps 145, with minimal (to no) etching of semiconductor layers 120, fin portion 105', dummy gates 130A-130C, gate spacers 132, and/or isolation features 125. Spacer layer 148 (and thus inner spacers 148') includes a material that is different than a material of semiconductor layers 120, a material of fin portion 105', a material of isolation features 125, a material of dummy gates 130A-130C, and/or materials of gate spacers 132 to achieve desired etching selectivity during the inner spacer etch. In some embodiments, spacer layer 148 includes a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, spacer layer 148 includes a low-k dielectric material, such as those described herein. In some embodiments, dopants (for example, p-type dopants and/or n-type dopants) are introduced into the dielectric material, such that spacer layer 148 includes a doped dielectric material. The inner spacer etch is a dry etching, a wet etching, other suitable etching process, or combinations thereof.

Turning to FIG. 2F (FIG. 3G) and FIG. 2G (FIG. 3H), method 10 proceeds with forming epitaxial source/drain structures 150 in source/drain recesses 140. For example, method 10 includes epitaxially growing an undoped semiconductor layer in a source/drain recess at block 25, such as undoped epitaxial layers 152 in source/drain recesses 140 (FIG. 2F and FIG. 3G); epitaxially growing a first doped semiconductor layer over the undoped semiconductor layer in the source/drain recess at block 30, such as epitaxial layers 154A and epitaxial layers 154B over undoped epitaxial layers 152 in source/drain recesses 140 (FIG. 2G and FIG. 3H); and epitaxially growing a second doped semiconductor layer over the first doped semiconductor layer in the source/drain recess at block 35, such as epitaxial layers 156A and epitaxial layers 156B over epitaxial layers 154A and epitaxial layers 154B, respectively, in source/drain recesses 140 (FIG. 2G and FIG. 3H). The first doped semiconductor layer, such as epitaxial layers 154A and epitaxial layers 154B, has a first dopant concentration, and the second doped semiconductor layer, such as epitaxial layers 156A and epitaxial layers 156B, has a second dopant concentration that is greater than the first dopant concentration. Method 10 can further include epitaxially growing a third doped semiconductor layer over the second doped semiconductor layer, such as epitaxial layers 158A and epitaxial layers 158B over epitaxial layers 156A and epitaxial layers 156B, respectively (FIG. 2G and FIG. 3H). Epitaxial growth of undoped epitaxial layers 152, epitaxial layers 154A and epitaxial layers 154B, epitaxial layers 156A and epitaxial layers 156B, and/or epitaxial layers 158A and epitaxial layers 158B is controlled (tuned) to enhance performance of multigate device 100. In some embodiments, epitaxial growth of the various layers of epitaxial source/drain structures 150 is controlled to maximize strain imparted to channel regions of multigate device 100 (here, semiconductor layers 120) by epitaxial source/drain structures 150. In some embodiments, maximizing a volume and/or maximizing a dopant concentration of epitaxial layers 156A and epitaxial layers 156B in epitaxial source/drain structures 150 increases strain imparted to channel regions of multigate device 100. In some embodiments, interfaces between undoped epitaxial layers 152 and epitaxial source/drain structures 150 have less (and, in some embodiments, no) defects than interfaces between doped epitaxial layers of epitaxial source/drain structures and a semiconductor substrate. Undoped epitaxial layers 152 thus provide a buffer between doped epitaxial layers (e.g., epitaxial layers 154A, epitaxial layers 154B, epitaxial layers 156B, and/or epitaxial layers 156B) and semiconductor substrate 105, which can reduce short channel effects in multigate device 100. In some embodiments, as described herein, profiles of undoped epitaxial layers 152 and/or epitaxial source/drain structures 150 are tuned based on active region size to mitigate short channel effects while optimizing performance (e.g., drive current).

In FIG. 2F (FIG. 3G), undoped or unintentionally doped (UID) epitaxial layers 152 are formed in bottom portions of source/drain recesses 140. Undoped epitaxial layers 152 are substantially free of dopants. Undoped epitaxial layers 152 include silicon, germanium, silicon germanium, other suitable semiconductor materials, or combinations thereof. In the depicted embodiment, undoped epitaxial layers 152 include silicon that is substantially free of n-type dopants and p-type dopants or silicon germanium that is substantially free of n-type dopants and p-type dopants. For purposes of the present disclosure, semiconductor materials having dopant concentrations less than about $5\times10^{18}$ cm$^{-3}$ are considered undoped and/or UID. In some embodiments, undoped epitaxial layers 152 have a dopant concentration of about $1\times10^{18}$ cm$^{-3}$ to about $5\times10^{18}$ cm$^{-3}$. Undoped epitaxial layers 152 have trough-shaped structures and physically contact semiconductor mesas 105P', fin portion 105', and/or substrate 105. For example, undoped epitaxial layers 152 have central, base regions 152A that extend laterally and/or horizontally between opposing sidewall regions 152B, where sidewall regions 152B extend vertically and/or project upwardly from central, base regions 152A, thereby forming troughs 152'. In some embodiments, troughs 152' have trapezoidal-shaped cross-sectional profiles, where troughs 152' have substantially flat, linear, and/or horizontally oriented bottoms (e.g., formed by central, base regions 152A of undoped epitaxial layers 152) that extend between opposing substantially tapered, slanted, and/or vertically oriented sidewalls (e.g., formed by sidewall regions 152B of undoped epitaxial layers 152). In some embodiments, the trough-shaped structures are U-shaped structures, where sidewalls regions 152B are substantially linear and/or substantially vertically extending sections of the U-shaped structures and central, base regions 152A are substantially curvilinear and/or substantially horizontally extending sections of the U-shaped structures. In some embodiments, the trough-shaped structures are V-shaped structures, where sidewalls regions 152B are substantially slanted and/or substantially vertically extending sections of the V-shaped structures and central, base regions 152A are substantially pointed sections of the V-shaped structures.

Accordingly, bottom portions of source/drain recesses 140 formed by semiconductor mesas 105P', fin portion 105', and/or substrate 105 have portions partially filled by undoped epitaxial layers 152 ("partially-filled bottom portions") and portions filled by undoped epitaxial layers 152 ("filled bottom portions"). Partially-filled bottom portions have height h1 along the z-direction and filled bottom portions have height h2 along the z-direction. Height h1 corresponds with a depth d1 of troughs 152' into fin portion 105' and/or substrate 105, where depth d1 is between top surfaces of semiconductor mesas 105P' and lowest points of top surfaces of undoped epitaxial layers 152 relative to the top surfaces of semiconductor mesas 105P'. Height h1/depth d1 also correspond with a remaining depth of source/drain recesses 140 into fin portion 105' and/or substrate 105 ($d_{remaining}$). For example, the remaining depth of source/drain recesses 140 into fin portion 105' and/or substrate 105 is given by a difference between depth d and height h1 (i.e., $d_{remaining} = d - h1$). In some embodiments, a minimum thickness of undoped epitaxial layers 152 along the z-direction is given by height h2, and a maximum thickness of undoped epitaxial layers 152 along the z-direction is given by a sum of height h1 and height h2. In some embodiments, undoped epitaxial layers 152 have a central portion disposed between end portions, where the central portion has the minimum thickness and the end portions have the maximum thickness.

In some embodiments, the central portion and/or the end portions have varying thicknesses. For example, moving along the x-direction from semiconductor mesas 105P' towards the central portion, end portions may have a thickness along the z-direction that decreases from a maximum thickness to a minimum thickness or a thickness greater than the minimum thickness but less than the maximum thickness. In another example, moving along the x-direction from a first end portion to a second end portion, the central portion may have a thickness along the z-direction that decreases from a thickness that is greater than the minimum thickness but less than the maximum thickness at the first end portion to the minimum thickness at a mid-point and then increases from the minimum thickness at the mid-point to a thickness that is greater than the minimum thickness but less than the maximum thickness at the second end portion. In such embodiments, the central portion may have a curvilinear top surface. In some embodiments, moving along the x-direction from a first end portion to a second end portion, the central portion has a substantially uniform thickness along the z-direction. In such embodiments, the central portion may have a substantially flat, linear top surface.

Height h1/depth d1 and height h2 are controlled to maximize a volume of undoped epitaxial layers 152 below top surfaces of semiconductor mesas 105P' while maximizing a volume of subsequently formed doped epitaxial layers (i.e., epitaxial layers 156A and/or epitaxial layers 156B) of epitaxial source/drain structures 150 above top surfaces of semiconductor mesas 105P'. If height h1/depth d1 are too small (e.g., less than or equal to 0 nm), undoped epitaxial layers 152 may protrude above top surfaces of semiconductor mesas 105P' and into portions of epitaxial source/drain structure 150 intended to impart strain on channel regions (i.e., semiconductor layers 120), thereby undesirably reducing such strain. If height h1/depth d1 are too large (e.g., greater than about 30 nm), a volume of undoped epitaxial layers 152 may be too small below top surfaces of semiconductor mesas 105P' and/or a thickness of undoped epitaxial layers 152 along sidewalls of semiconductor mesas 105P' may be too thin, such that undoped epitaxial layers 152 provide an insufficient buffer between semiconductor mesas 105P' and doped epitaxial layers of epitaxial source/drain structures 150, thereby negating the SCE reduction function of undoped epitaxial layers 152. In some embodiments, height h1/depth d1 is about 0 nm to about 30 nm. Height h1/depth d1 less than about 0 nm may result in undoped epitaxial layers 152 protruding above top surfaces of semiconductor mesas 105P' and into portions of epitaxial source/drain structure 150 intended to impart strain on channel regions (i.e., semiconductor layers 120) and thereby reduce such strain. Height h1/depth d1 greater than about 30 nm may result in a thickness of undoped epitaxial layers 152 along sidewalls of semiconductor mesas 105P' that is too thin, such that undoped epitaxial layers 152 provide an insufficient buffer between semiconductor mesas 105P' and doped epitaxial layers of epitaxial source/drain structures 150, thereby negating the SCE reduction function of undoped epitaxial layers 152.

The epitaxial source/drain fabrication techniques herein tune height h1 and height h2 based on active region size, where tuning height h1 and height h2 based on active region size can reduce (and, in some embodiments, eliminate) SCEs experienced by small active region devices and/or large active region devices while optimizing performance of small active region devices and/or large active region devices. In some embodiments, height h1 and height h2 are tuned by the process used to form undoped epitaxial layers 152. In some embodiments, height h1 and height h2 are tuned as a result of a profile of source/drain recesses 140 achieved by tuning the source/drain etch. For example, turning to FIG. 4B, height h1 is equal to a height H3 and height h2 is equal to a height H4 for multigate device S (i.e., small active region device), height h1 is equal to a height H5 and height h2 is equal to a height H6 for multigate device L (i.e., large active region device), height H3 is less than height H4 (H3<H4), height H5 is less than height H6 (H5<H6), and height H3 is less than height H5 (H3<H5). In other words, remaining depth of source/drain recesses 140 in fin portion 105' and/or substrate 105 in multigate device S is less than remaining depth of source/drain recesses 140 in fin portion 105' and/or substrate 105 in multigate device L. Accordingly, by tuning source/drain profiles of source/drain recesses 140 based on active region size as done in FIG. 4A (e.g., providing different source/drain depths and/or different height ratios) and/or tuning profiles of undoped epitaxial layers 152 based on active region size as done in FIG. 4B (e.g., providing undoped epitaxial layers 152 different heights/depths and/or height ratios), the disclosed epitaxial source/drain fabrication methods optimize undoped epitaxial layers 152 based on active region size (i.e., smaller depths for small active region devices and larger depths for large active region devices).

In some embodiments, height H3 is about 0 nm to about 10 nm. In some embodiments, a ratio of height H3 to height H4 is about 0.05 to about 0.3. Height H3 less than 0 nm and/or a ratio of height H3 to height H4 that is less than 0.05 may result in undoped epitaxial layers 152 protruding above top surfaces of semiconductor mesas 105P' and into portions of epitaxial source/drain structure 150 intended to impart strain on channel regions (i.e., semiconductor layers 120) and thereby undesirably reduce such strain. Height H3 greater than 10 nm and/or a ratio of height H3 to height H4 that is greater than 0.03 may result in minimal deposition of undoped epitaxial material in source/drain recesses 140 and/or a thickness of undoped epitaxial layers 152 along sidewalls of semiconductor mesas 105P' that is too thin, such that undoped epitaxial layers 152 provide an insufficient buffer between semiconductor mesas 105P' and doped epitaxial layers of epitaxial source/drain structures 150, thereby negating the SCE reduction function of undoped epitaxial layers 152.

In some embodiments, height H5 is about 10 nm to about 30 nm. In some embodiments, a ratio of height H5 to height H6 is about 0.1 to about 0.5. Height H5 less than 10 nm and/or a ratio of height H5 to height H6 that is less than 0.1 may result in undoped epitaxial layers 152 protruding above top surfaces of semiconductor mesas 105P' and into portions of epitaxial source/drain structure 150 intended to impart strain on channel regions (i.e., semiconductor layers 120) and thereby undesirably reduce such strain. Height H5 greater than 30 nm and/or a ratio of height H5 to height H6 that is greater than 0.5 may result in minimal deposition of undoped epitaxial material in source/drain recesses 140 and/or a thickness of undoped epitaxial layers 152 along sidewalls of semiconductor mesas 105P' that is too thin, such that undoped epitaxial layers 152 provide an insufficient buffer between semiconductor mesas 105P' and doped epitaxial layers of epitaxial source/drain structures 150, thereby negating the SCE reduction function of undoped epitaxial layers 152.

In some embodiments, undoped epitaxial layers 152 are formed by a selective epitaxial growth (SEG) process that selectively deposits (grows) semiconductor material (e.g., silicon or silicon germanium) from semiconductor surfaces (e.g., semiconductor mesas 105P', fin portion 105', substrate 105, and/or semiconductor layers 120) while limiting (or preventing) growth of semiconductor material from dielectric surfaces and/or non-semiconductor surfaces (e.g., inner spacers 148', dummy gates 130A-130C, gate spacers 132', and/or isolation features 125). For example, silicon and/or germanium grows from semiconductor layers 120 but does not grow from semiconductor mesas 105P', fin portion 105', substrate 105, and/or semiconductor layers 120. In some embodiments, the SEG process is a selective CVD process that introduces a silicon-containing precursor and/or a germanium-containing precursor and a carrier gas into a process chamber, where the silicon-containing precursor and/or the germanium-containing precursor interact with semiconductor mesas 105P', fin portion 105', substrate 105, and/or semiconductor layers 120 to form undoped epitaxial layers 152. The silicon-containing precursor includes silane ($SiH_4$), disilane ($Si_2H_6$), dichlorosilane ($SiH_2Cl_2$) (DCS), trichlorosilane ($SiHCl_3$), silicon tetrachloride ($SiCl_4$), other suitable silicon-containing precursor, or combinations thereof. The germanium-containing precursor includes germane ($GeH_4$), digermane ($Ge_2H_6$), germanium tetrachloride ($GeCl_4$), germanium dichloride ($GeCl_2$), other suitable germanium-containing precursor, or combinations thereof. The carrier gas may be an inert gas, such as a hydrogen-containing gas (e.g., $H_2$), an argon-containing gas (e.g., Ar), a helium-containing gas (e.g., He), a nitrogen-containing gas (e.g., $N_2$), a xenon-containing gas, other suitable inert gas, or combinations thereof. Though various parameters of the selective CVD process can be adjusted (tuned) to ensure that the silicon-containing precursor and/or the germanium-containing precursor nucleates and grows selectively from and/or quicker from semiconductor surfaces, some silicon and/or germanium material may nucleate and grow on dielectric surfaces and/or non-semiconductor surfaces. To prevent or limit such growth, the selective CVD process can further introduce an etchant-containing precursor into the process chamber that can interact with dielectric surfaces and/or non-semiconductor surfaces of multigate device 100 (e.g., isolation features 125, dummy gates 130A-130C, gate spacers 132, and/or inner spacers 148'). The etchant-containing precursor includes chlorine ($Cl_2$), hydrogen chloride (HCl), other etchant-containing precursors that can facilitate desired semiconductor material (e.g., silicon and/or germanium) growth selectivity, or combinations thereof. Because growth of silicon and/or germanium material on and from dielectric surfaces and/or non-semiconductor surfaces, if any, is largely discontinuous and discrete compared to growth of silicon and/or germanium material on and from semiconductor surfaces, which is likely continuous and merged, the etchant-containing precursor can remove any silicon and/or germanium material from dielectric surfaces and/or non-semiconductor surfaces faster than silicon and/or germanium material from semiconductor surfaces. The selective CVD processes thus simultaneously deposit and etch semiconductor material but are configured to have a deposition rate that is greater than an etching rate to ensure net deposition of semiconductor material. In some embodiments, the etchant-containing precursor prevents any nucleation of semiconductor material on dielectric surfaces and/or non-semiconductor surfaces. Because epitaxial layers 152 are undoped, no dopant-containing precursors are introduced into the process chamber during the selective CVD process and/or other SEG process.

Various deposition parameters can be tuned to selectively deposit the semiconductor material on semiconductor surfaces, such as deposition gas composition, carrier gas composition, deposition gas flow rate, carrier gas flow rate, deposition time, deposition pressure, deposition temperature, source power, RF bias voltage, DC bias voltage, RF bias power, DC bias power, other suitable deposition parameters, or combinations thereof. In some embodiments, multigate device 100 is exposed to a deposition mixture that includes DCS and/or $SiH_4$ (silicon-containing precursor), $H_2$ (carrier precursor), and HCl (etchant-containing precursor) when forming undoped epitaxial layers 152. In some embodiments, the selective CVD process implements a deposition temperature of about 600° C. to about 750° C. In some embodiments, the selective CVD process implements a deposition pressure of about 10 Torr to about 100 Torr. In some embodiments, the selective CVD process is configured as a bottom-up deposition process (i.e., from bottom to top of source/drain recesses 140), such that undoped epitaxial layers 152 grow from semiconductor mesas 105P', fin portion 105', and/or substrate 105, but not semiconductor layers 120. In some embodiments, an etching process is performed after the selective CVD process to remove semiconductor material (e.g., silicon and/or germanium) that may have formed on semiconductor layers 120. The post-deposition etch includes a dry etching, a wet etching, other suitable etching process, or combinations thereof. Various etching parameters can be tuned to selectively etch the semiconductor material with minimal (to no) etching of inner spacers 148', dummy gates 130A-130C, gate spacers 132, and/or isolation features 125, such as etch gas composition, carrier gas composition, etch gas flow rate, carrier gas flow rate, etch time, etch pressure, etch temperature, source power, RF bias voltage, DC bias voltage, RF bias power, DC bias power, other suitable etch parameters, or combinations thereof. For example, an etchant is selected for the post-deposition etch that can remove semiconductor material, such as silicon and/or germanium, at a higher rate than the material of inner spacers 148', dummy gates 130A-130C, gate spacers 132, and/or isolation features 125 (e.g., dielectric material, such as silicon oxide, and/or polysilicon material) (i.e., the etchant has a high etch selectivity with respect to semiconductor material). In some embodiments, the post-deposition etch is a dry etching that implements a chlorine-containing etch gas (e.g., HCl) and a hydrogen-containing carrier gas (e.g., $H_2$). In some embodiments, post-deposition etch implements a flow rate of HCl of about 200 standard cubic centimeters per minute (sccm) to about 500 sccm.

The selective CVD process and the post-deposition etch are performed "in-situ." For example, the selective CVD process and the post-deposition etch are performed within the same process chamber, such as a process chamber of a CVD tool, such that a workpiece (wafer) having multigate device 100 fabricated thereon remains under vacuum conditions. As such, "in-situ" also generally refers to performing various processes on a workpiece without exposing the wafer to an external ambient (for example, external to an IC processing system), such as oxygen. Performing the selective CVD process and the post-deposition etch can thus minimize (or eliminate) exposure to oxygen and/or other external ambient during processing.

In contrast, the selective CVD process for forming undoped epitaxial layers 152 and epitaxial growth processes for forming doped epitaxial layers of epitaxial source/drain structures 150 (i.e., epitaxial layers 154A, epitaxial layers 154B, epitaxial layers 156A, epitaxial layers 156B, epitaxial layers 158A, and/or epitaxial layers 158B) are performed "ex-situ." For example, undoped epitaxial layers 152 of epitaxial source/drain structures 150 and doped epitaxial layers of epitaxial source/drain structures 150 are performed in different process chambers, such as different process chambers of a CVD tool, such that a workpiece (wafer) having multigate device 100 fabricated thereon does not remain under vacuum conditions between forming undoped epitaxial layers 152 and doped epitaxial layers. For example, vacuum conditions may be broken when the workpiece is transferred from one process chamber (e.g., for depositing undoped epitaxial layers 152) to another process chamber (e.g., for depositing doped epitaxial layers). As such, "ex-situ" also generally refers to performing various processes on a workpiece where the wafer may be exposed to an external ambient (for example, external to an IC processing system), such as oxygen, between processes.

In FIG. 2G (FIG. 3H), epitaxial layers 154A and epitaxial layers 154B are formed over undoped epitaxial layers 152. Epitaxial layers 154A and epitaxial layers 154B are disposed along sidewalls and bottoms of source/drain recesses 140 and partially fill source/drain recesses 140. Epitaxial layers 154A and epitaxial layers 154B physically contact epitaxial layers 152, substrate mesas 105P', semiconductor layers 120, and/or inner spacers 148'. Epitaxial layers 154A and epitaxial layers 154B are discontinuous epitaxial layers having discrete and separate sidewall epitaxial portions and bottom epitaxial portions. Sidewall epitaxial portions are disposed on sidewalls of semiconductor layers 120 and sidewall epitaxial portions on adjacent semiconductor layers 120 are not connected to one another. In some embodiments, such as depicted, sidewall epitaxial portions wrap respective semiconductor layers 120 and extend over tops and/or bottoms of respective semiconductor layers 120. Bottom epitaxial portions are disposed on tops of undoped epitaxial layers 152 and bottom epitaxial portions are not connected to sidewall epitaxial portions. In some embodiments, such as depicted, bottom epitaxial portions physically contact portions of top surfaces of semiconductor mesas 105P' that are not covered by undoped epitaxial layers 152, such as portions of top surfaces of semiconductor mesas 105P' that extend between bottommost inner spacers 148' and undoped epitaxial layers 152.

Bottom epitaxial portions have a thickness t1 along the z-direction (i.e., a bottom thickness) and sidewall epitaxial portions have a thickness t2 along the x-direction (i.e., a sidewall thickness). Thickness t1 is less than height h2 of undoped epitaxial layers 152. In the depicted embodiment, thickness t1 is greater than height h1, bottom epitaxial portions fill troughs 150', and bottom epitaxial portions project above top surfaces of semiconductor mesas 105P'. In some embodiments, thickness t1 is less than height h1, bottom epitaxial portions do not fill troughs 150', and source/drain recesses 140 still extend below top surfaces of semiconductor mesas 105P'. In some embodiments, thickness t1 is about equal to height h1 and bottom epitaxial portions fill troughs 150' but do not project above top surfaces of semiconductor mesas 105P'. In some embodiments, thickness t1 is about 10 nm to about 20 nm. In some embodiments, thickness t2 is about 2 nm to about 10 nm. Thickness t1 and thickness t2 are controlled to maximize a volume of subsequently formed epitaxial layers 156A and epitaxial layers 156B in epitaxial source/drain structures 150. If thickness t1 and/or thickness t2 are too thick (e.g., greater than about 20 nm and/or greater than about 10 nm, respectively), a volume of epitaxial layers 156A and/or epitaxial layers 156B in epitaxial source/drain structures 150 may be too small and provide insufficient strain to channel regions (i.e., semiconductor layers 120) of multigate device 100. If thickness t1 and/or thickness t2 are too thin (e.g., less than about 10 nm and/or less than about 2 nm, respectively), epitaxial layers 154A and/or epitaxial layers 154B may provide insufficient growth surfaces from which to subsequently form epitaxial layers 156A and epitaxial layers 156B, respectively. In some embodiments, where undoped epitaxial layers 152 have different lattice constants and/or different lattice structures than epitaxial layers 156A and/or epitaxial layers 156B, epitaxial layers 154A and/or epitaxial layers 154B can function as buffer layers. For example, a lattice constant and/or a lattice structure of epitaxial layers 154A can gradually change from a lattice constant and/or a lattice structure similar to that of undoped epitaxial layers 152 to a lattice constant and/or a lattice structure similar to that of epitaxial layers 156A, and/or a lattice constant and/or a lattice structure of epitaxial layers 154B can gradually change from a lattice constant and/or a lattice structure similar to that of undoped epitaxial layers 152 to a lattice constant and/or a lattice structure similar to that of epitaxial layers 156B.

Epitaxial layers 156A and epitaxial layers 156B are formed over epitaxial layers 154A and epitaxial layers 154B, respectively, to fill source/drain recesses 140. Epitaxial layers 156A and epitaxial layers 156B are separated from semiconductor layers 120, but not inner spacers 148', by sidewall epitaxial portions of epitaxial layers 154A and epitaxial layers 154B, respectively. In the depicted embodiment, epitaxial layers 156A and epitaxial layers 156B wrap epitaxial layers 154A and epitaxial layers 154B, respectively, and physically contact inner spacers 148'. In some embodiments, sidewall epitaxial portions of epitaxial layers 154A and/or epitaxial layers 154B extend at least partially over inner spacers 148', such that epitaxial layers 154A and epitaxial layers 154B separate portions of epitaxial layers 156A and epitaxial layers 156B, respectively, from inner spacers 148'. Epitaxial layers 156A and epitaxial layers 156B are further separated from undoped epitaxial layers 152 by bottom epitaxial portions of epitaxial layers 154A and epitaxial layers 154B, respectively. Epitaxial layers 156A and epitaxial layers 156B have a thickness t3 along the z-direction and a thickness t4 along the x-direction. Thickness t3 is greater than thickness t1 of bottom epitaxial portions of epitaxial layers 154A and epitaxial layers 154B and greater than height h2 of undoped epitaxial layers 152. In some embodiments, thickness t3 is about 40 nm to about 100 nm. In some embodiments, thickness t4 is about 20 nm to about 60 nm. In the depicted embodiment, where epitaxial layers 154A and epitaxial layers 154B fill troughs 150', epitaxial layers 156A and epitaxial layers 156B are disposed above tops surfaces of semiconductor mesas 105P'. In some embodiments, where epitaxial layers 154A and epitaxial layers 154B do not fill troughs 150', epitaxial layers 156A and epitaxial layers 156B fill remainders of troughs 150' and extend below tops surfaces of semiconductor mesas 105P'. In some embodiments, where thickness t1 of epitaxial layers 154A and epitaxial layers 154B is about equal to height h1, epitaxial layers 156A and epitaxial layers 156B may extend to about top surfaces of semiconductor mesas 105P'.

Epitaxial layers 158A and epitaxial layers 158B are formed over epitaxial layers 156A and epitaxial layers 156B, respectively. Epitaxial layers 158A and epitaxial layers 158B can be referred to as cap layers. In some embodiments, epitaxial layers 158A and epitaxial layers 158B function as cap layers that protect epitaxial layers 156A and epitaxial layers 156B (i.e., heavily doped portions of epitaxial source/drain structures 150), respectively, during subsequent processing, such as processing associated with fabricating source/drain contacts. Epitaxial layers 158A and epitaxial layers 158B physically contact epitaxial layers 156A and epitaxial layers 156B, respectively, and in the depicted embodiment, cover top surfaces of layers 156A and epitaxial layers 156B, respectively. Epitaxial layers 158A and epitaxial layers 158B further extend between and physically contact gate spacers 132 of adjacent dummy gates 130A-130C. In some embodiments, epitaxial layers 158A and epitaxial layers 158B further physically contact portions of topmost semiconductor layers 120 that are not covered by epitaxial layers 154A and/or epitaxial layers 156A and epitaxial layers 154B and/or epitaxial layers 156B, respectively. Epitaxial layers 158A and epitaxial layers 158B have a thickness t5 along the z-direction and thickness t6 along the x-direction. In some embodiments, thickness t5 is about 10 nm to about 30 nm. In the depicted embodiment, because epitaxial layers 156A and epitaxial layers 156B have recessed top surfaces and thus do not fill source/drain recesses 140, epitaxial layers 158A and epitaxial layers 158B fill remainders of source/drain recess 140 and extend below top surfaces of topmost semiconductor layers 120. In such embodiments, thickness t5 is given by a sum of a thickness t7 along the z-direction, which corresponds with a thickness of bottom epitaxial portions of epitaxial layers 158A and epitaxial layers 158B below top surfaces of topmost semiconductor layers 120, and a thickness t8 along the z-direction, which corresponds with a thickness of top epitaxial portions of epitaxial layers 158A and epitaxial layers 158B above top surfaces of topmost semiconductor layers 120. In some embodiments, thickness t8 is about 1 nm to about 15 nm. In the depicted embodiment, thickness t6 is about the same as thickness t4 of epitaxial layers 156A and epitaxial layers 156B, respectively. In some embodiments, thickness t6 is about 20 nm to about 60 nm. In some embodiments, thickness t6 varies when moving along the z-direction towards substrate 105. For example, thickness t6 decreases from a maximum thickness to a minimum thickness. In some embodiments, thickness t6 of top epitaxial portions is substantially uniform and is the maximum thickness and thickness t6 of bottom epitaxial portions decreases from a thickness less than the maximum thickness to the minimum thickness. In some embodiments, thickness t6 of top epitaxial portions increases from a thickness less than the maximum thickness to the maximum thickness.

Thickness t8 corresponds with a height of epitaxial layers 158A and epitaxial layers 158B above top surfaces of topmost semiconductor layers 120, which can be referred to as a raised height of epitaxial source/drain structures 150. Turning to FIG. 4C, the present disclosure envisions tuning thickness t8 (i.e., raised height of epitaxial source/drain structures 150) based on active region size. In some embodiments, thickness t8 is tuned by the process used to form epitaxial layers 158A and epitaxial layers 158B (collectively represented as epitaxial layers 158 in FIG. 4C). In some embodiments, thickness t8 is tuned as a result of a profile of source/drain recesses 140 achieved by tuning the source/drain etch and/or tuning epitaxial growth of epitaxial layers 156A and epitaxial layers 156B (collectively represented as epitaxial layers 156 in FIG. 4C), epitaxial layers 154A and epitaxial layers 154B (collectively represented as epitaxial layers 154 in FIG. 4C), and/or undoped epitaxial layers 152. It is noted that, in contrast to FIG. 2G, when deposited, epitaxial layers 154 extend continuously (i.e., without interruption) along sidewalls and bottoms of source/drain recesses 140. In such embodiments, epitaxial layers 154 separate epitaxial layers 156 from semiconductor layers 120, inner spacers 148', and undoped epitaxial layers 152, such that epitaxial layers 156 do not physically contact semiconductor layers 120, inner spacers 148', or undoped epitaxial layers 152.

In FIG. 4C, thickness t8 is equal to a height H7 for multigate device S (i.e., small active region device), thickness t8 is equal to a height H8 for multigate device L (i.e., large active region device), and height H7 is less than height H8 (H7<H8). In other words, raised height of epitaxial source/drain structures 150 in multigate device S is less than raised height of epitaxial source/drain structures 150 in multigate device L. In some embodiments, height H7 is about 1 nm to about 5 nm. In some embodiments, height H8 is about 5 nm to about 15 nm. A ratio of height H7 to height H8 (i.e., raised height ratio=H7/H8) is less than about one. In some embodiments, the raised height ratio is about 0.2 to about 0.7, where raised height ratios less than 0.2 may provide large active region devices with epitaxial source/drain structures 150 having smaller than desired raised heights and thus prevent performance optimization of large active region devices while raised height ratios greater than 0.7 may provide small active region devices with epitaxial source/drain structures 150 having larger than desired raised heights and thus prevent performance optimization of small active region devices. Accordingly, by modifying source/drain profiles of source/drain recesses 140 based on active region size as done in FIG. 4A (e.g., providing different source/drain depths and/or different height ratios in small active regions and large active regions) and/or forming undoped epitaxial layers 152 as done in FIG. 4B, the disclosed epitaxial source/drain fabrication methods can optimize raised heights for epitaxial source/drain structures 150 based on active region size (i.e., smaller raised heights for small active region devices and larger raised heights for large active region devices).

Returning to FIG. 2G (FIG. 3H), epitaxial layers 154A and epitaxial layers 156A include the same semiconductor material but with different constituent concentrations. The semiconductor material can include silicon, germanium, silicon germanium, other suitable semiconductor material, or combinations thereof. In the depicted embodiment, where transistor region 106A is a p-type transistor region, epitaxial layers 154A and epitaxial layers 156A include p-doped silicon germanium but with different p-type concentrations. For example, a p-type dopant concentration of epitaxial layers 154A is less than a p-type dopant concentration of epitaxial layers 156A. In some embodiments, epitaxial layers 154A have a p-type dopant concentration (e.g., a boron concentration) of about $1 \times 10^{20}$ cm$^{-3}$ to about $5 \times 10^{20}$ cm$^{-3}$, and epitaxial layers 156A have a p-type dopant concentration (e.g., boron concentration) of about $5 \times 10^{20}$ cm$^{-3}$ to about $2 \times 10^{21}$ cm$^{-3}$. In some embodiments, epitaxial layers 154A have a p-type dopant concentration of about 0.2 at % to about 1 at %, and epitaxial layers 156A have a p-type dopant concentration of about 1 at % to about 4 at %. In some embodiments, epitaxial layers 154A and epitaxial layers 156A further have different germanium concentrations. For example, a germanium concentration of epitaxial layers 156A is greater than a germanium concentration of epitaxial layers 154A. In furtherance of the depicted embodiment, semiconductor layers 120 may include germanium in transistor region 106A, and a germanium concentration in epitaxial layers 154A is about the same as a germanium concentration in semiconductor layers 120. For example, epitaxial layers 154A and semiconductor layers 120 in transistor region 106A may have a germanium concentration of about 25 at %. The present disclosure contemplates embodiments where epitaxial layers 154A and epitaxial layers 156A have different semiconductor materials with same or different dopant concentrations.

Epitaxial layers 154B and epitaxial layers 156B include the same semiconductor material but with different constituent concentrations. The semiconductor material can include silicon, germanium, silicon germanium, other suitable semiconductor material, or combinations thereof. In the depicted embodiment, where transistor region 106B is an n-type transistor region, epitaxial layers 154B and epitaxial layers 156B include n-doped silicon but with different n-type concentrations. For example, an n-type dopant concentration of epitaxial layers 154B is less than an n-type dopant concentration of epitaxial layers 156B. In some embodiments, epitaxial layers 154B have an n-type dopant concentration (e.g., a phosphorous concentration or an arsenic concentration) of about $1 \times 10^{20}$ cm$^{-3}$ to about $5 \times 10^{20}$ cm$^{-3}$, and epitaxial layers 156B have an n-type dopant concentration (e.g., a phosphorous concentration or an arsenic concentration) of about $5 \times 10^{20}$ cm$^{-3}$ to about $2 \times 10^{21}$ cm$^{-3}$. In some embodiments, epitaxial layers 154B have an n-type dopant concentration of about 0.2 at % to about 1 at %, and epitaxial layers 156B have an n-type dopant concentration of about 1 at % to about 4 at %. In some embodiments, epitaxial layers 154B and epitaxial layers 156B further have different silicon concentrations. In some embodiments, epitaxial layers 154B and/or epitaxial layers 156B are substantially free of germanium (i.e., germanium concentration is about 0 at %). The present disclosure contemplates embodiments where epitaxial layers 154B and epitaxial layers 156B have different semiconductor materials with same or different dopant concentrations.

Epitaxial layers 158A and epitaxial layers 158B include a semiconductor material, such as silicon, germanium, silicon germanium, other suitable semiconductor material, or combinations thereof. In the depicted embodiment, where transistor region 106A is a p-type transistor region and transistor region 106B is an n-type transistor region, epitaxial layers 158A include p-doped silicon germanium and epitaxial layers 158B include n-doped silicon. In some embodiments, epitaxial layers 158A have a p-type dopant concentration (e.g., a boron concentration) of about $1 \times 10^{21}$ cm$^{-3}$ to about $3 \times 10^{21}$ cm$^{-3}$, and epitaxial layers 158B have an n-type dopant concentration (e.g., a phosphorous concentration or an arsenic concentration) of about $1 \times 10^{21}$ cm$^{-3}$ to about $3 \times 10^{21}$ cm$^{-3}$. In some embodiments, epitaxial layers 158A have a p-type dopant concentration of about 1 at % to about 6 at %, and epitaxial layers 158B have an n-type dopant concentration of about 1 at % to about 6 at %. Doping epitaxial layers 158A and epitaxial layers 158B, such as provided for herein, can reduce source/drain contact resistance ($R_{CSD}$) (i.e., resistance to a flow of current between epitaxial source/drain structures 150 and subsequently formed source/drain contacts). In some embodiments, dopant concentrations of epitaxial layers 158A and epitaxial layers 158B are greater than dopant concentrations of epitaxial layers 156A and epitaxial layers 156B, respectively. In some embodiments, dopant concentrations of epitaxial layers 158A and/or epitaxial layers 158B are equal to dopant concentrations of epitaxial layers 156A and epitaxial layers 156B, respectively. In some embodiments, such as depicted, dopant concentrations of epitaxial layers 158A and/or epitaxial layers 158B are less than dopant concentrations of epitaxial layers 156A and epitaxial layers 156B, respectively. In some embodiments, epitaxial layers 158A and/or epitaxial layers 158B are substantially free of dopants (e.g., undoped and/or UID).

Epitaxial layers 154A and epitaxial layers 154B can grow from semiconductor layers 120 and undoped epitaxial layers 152; epitaxial layers 156A and epitaxial layers 156B can grow from epitaxial layers 154A and epitaxial layers 154B, respectively; and epitaxial layers 158A and epitaxial layers 158B can grow from epitaxial layers 156A and epitaxial layers 156B, respectively. Epitaxial layers 154A, epitaxial layers 154B, epitaxial layers 156A, epitaxial layers 156B, epitaxial layers 158A, and/or epitaxial layers 158B can be formed by epitaxy processes that implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy processes can use gaseous and/or liquid precursors that interact with the composition of substrate 105, fin portion 105', semiconductor layers 120, undoped epitaxial layers 152, epitaxial layers 154A, epitaxial layers 154B, epitaxial layers 156A, and/or epitaxial layers 156B. In some embodiments, epitaxial growth conditions, such as epitaxial growth precursors, epitaxial growth temperature, epitaxial growth time, epitaxial growth pressure, and/or other suitable epitaxial growth parameter, is tuned to achieve epitaxial growth on semiconductor surfaces with minimal (to no) growth on dielectric surfaces and/or non-semiconductor surfaces. In some embodiments, epitaxial layers 154A, epitaxial layers 154B, epitaxial layers 156A, epitaxial layers 156B, epitaxial layers 158A, and/or epitaxial layers 158B are doped during deposition by adding dopants to a source material of the epitaxy process. In some embodiments, epitaxial layers 154A, epitaxial layers 154B, epitaxial layers 156A, epitaxial layers 156B, epitaxial layers 158A, and/or epitaxial layers 158B are doped by an ion implantation process after a deposition process. In some embodiments, annealing processes are performed to activate dopants in epitaxial layers 154A, epitaxial layers 154B, epitaxial layers 156A, epitaxial layers 156B, epitaxial layers 158A, epitaxial layers 158B, and/or other source/drain regions of multigate device 100, such as HDD regions and/or LDD regions.

In the depicted embodiment, epitaxial layers 154A, epitaxial layers 154B, epitaxial layers 156A, epitaxial layers 156B, epitaxial layers 158A, and epitaxial layers 158B are formed by respective SEG processes. In some embodiments, the SEG processes are selective CVD processes, such as a remote plasma CVD (RPCVD) processes, that introduce a silicon-containing precursor and/or a germanium-containing precursor and a carrier gas into a process chamber, where the silicon-containing precursor and/or the germanium-containing precursor interact with semiconductor surfaces of multigate device 100 to form epitaxial layers 154A, epitaxial layers 154B, epitaxial layers 156A, epitaxial layers 156B, epitaxial layers 158A, and epitaxial layers 158B, respectively. The silicon-containing precursor includes SiH$_4$, Si$_2$H$_6$, DCS, SiHCl$_3$, SiCl$_4$, other suitable silicon-containing precursors, or combinations thereof. The germanium-containing precursor includes GeH$_4$, Ge$_2$H$_6$, GeCl$_4$, GeCl$_2$, other suitable germanium-containing precursors, or combinations thereof. The carrier gas may be an inert gas, such as H$_2$. In some embodiments, the selective CVD processes introduce a dopant-containing precursor into the process chamber to facilitate in-situ doping of epitaxial layers 154A, epitaxial layers 154B, epitaxial layers 156A, epitaxial layers 156B, epitaxial layers 158A, and/or epitaxial layers 158B. The dopant-containing precursor includes boron (e.g., B$_2$H$_6$), phosphorous (e.g., PH$_3$), arsenic (e.g., AsH$_3$), other suitable dopant-containing precursors, or combinations thereof. In some embodiments, the selective CVD processes introduce an etchant-containing precursor into the process chamber to prevent or limit growth of silicon material and/or germanium material on dielectric surfaces and/or non-semiconductor surfaces as described herein. In such embodiments, parameters of the selective CVD processes are tuned to ensure net deposition of semiconductor material on semiconductor surfaces. The etchant-containing precursor includes $Cl_2$, HCl, other etchant-containing precursors that can facilitate desired semiconductor material (e.g., silicon and/or germanium) growth selectivity, or combinations thereof.

In some embodiments, multigate device 100 is exposed to a deposition gas that includes $GeH_4$ (germanium-containing precursor), DCS (silicon-containing precursor), $H_2$ (carrier precursor), $B_2H_6$ (dopant-containing precursor), and HCl (etchant-containing precursor) when forming epitaxial layers 154A, epitaxial layers 156A, and/or epitaxial layers 158A. In some embodiments, multigate device 100 is exposed to a deposition gas that includes DCS (silicon-containing precursor), $H_2$ (carrier precursor), $PH_3$ and/or $AsH_3$ (dopant-containing precursor), and HCl (etchant-containing precursor) when forming epitaxial layers 154B, epitaxial layers 156B, and/or epitaxial layers 158B. In some embodiments, multigate device 100 is exposed to a deposition gas that includes $GeH_4$ (germanium-containing precursor), $H_2$ (carrier precursor), $B_2H_6$ (dopant-containing precursor), and HCl (etchant-containing precursor) when forming epitaxial layers 154A, epitaxial layers 156A, and/or epitaxial layers 158A. In some embodiments, multigate device 100 is exposed to a deposition gas that includes $SiH_4$ (silicon-containing precursor), $H_2$ (carrier precursor), $PH_3$ and/or $AsH_3$ (dopant-containing precursor), and HCl (etchant-containing precursor) when forming epitaxial layers 154B, epitaxial layers 156B, and/or epitaxial layers 158B. In some embodiments, when forming epitaxial layers 156A and/or epitaxial layers 156B (which have a highest volume and a highest dopant concentration of the epitaxial layers in epitaxial source/drain structures 150), an etching rate and a deposition rate are tuned to provide at least partial removal (etching) of doped semiconductor material from top surfaces of topmost semiconductor layers 120, in particular, portions of top surfaces of topmost semiconductor layers 120 that are directly adjacent to gate structures of multigate device 100 (i.e., gate spacers 132 and dummy gates 130). In such embodiments, removing heavily doped semiconductor material from the portions of top surfaces of topmost semiconductor layers 120 that are directly adjacent to gate structures of multigate device 100 can reduce diffusion of dopant from epitaxial source/drain structures 150 into subsequently formed metal gates. In furtherance of such embodiments, epitaxial layers 158A and epitaxial layers 158B (which may have lower dopant concentrations than epitaxial layers 156A and epitaxial layers 156B, respectively) physically contact portions of top surfaces of topmost semiconductor layers 120 that are directly adjacent to gate structures of multigate device 100.

Doped epitaxial layers of epitaxial source/drain structures 150 for different types of transistors (e.g., NMOS and PMOS) may be formed in different process chambers. In some embodiments, epitaxial layers 154A, epitaxial layers 156A, and/or epitaxial layers 158A of epitaxial source/drain structure 150 in transistor region 106A (e.g., where p-type transistors of multigate device 100 are formed) are formed in a first CVD process chamber (or tool) and epitaxial layers 154B, epitaxial layers 156B, and/or epitaxial layers 158B of epitaxial source/drain structure 150 in transistor region 106B (e.g., where n-type transistors of multigate device 100 are formed are formed) in a second CVD process chamber. In some embodiments, doped epitaxial source/drain formation is a cyclic lithography/deposition process. For example, the doped epitaxial source/drain formation can include performing a first lithography process to form a first masking layer that covers transistor region 106A and exposes transistor region 106B; performing a first deposition sequence to form epitaxial layers 154A, epitaxial layers 156A, and/or epitaxial layers 158A; removing the first masking layer; performing a second lithography process to form a second masking layer that exposes transistor region 106A and covers transistor region 106B; performing a second deposition sequence to form epitaxial layers 154B, epitaxial layers 156B, and/or epitaxial layers 158B; and removing the second masking layer.

In some embodiments, the first deposition sequence is three separate deposition steps sequentially performed to form epitaxial layers 154A, epitaxial layers 156A, and/or epitaxial layers 158A and/or the second deposition sequence is three separate deposition steps sequentially performed to form epitaxial layers 154B, epitaxial layers 156B, and/or epitaxial layers 158B. In such embodiments, deposition may be paused between each deposition step, for example, by stopping a flow of a deposition gas into a process chamber between deposition steps. In some embodiments, a purging process is performed between each deposition step that removes deposition gas of a preceding deposition step and any by-products therefrom from the process chamber before performing a subsequent deposition step. In some embodiments, the first deposition sequence is one continuous deposition process having three different sets of deposition conditions for forming epitaxial layers 154A, epitaxial layers 156A, and/or epitaxial layers 158A and/or the second deposition sequence is one continuous deposition process having three different sets of deposition conditions for forming epitaxial layers 154B, epitaxial layers 156B, and/or epitaxial layers 158B. The deposition conditions can include silicon-containing precursor flow and/or concentration, germanium-containing precursor flow and/or concentration, dopant-containing precursor flow and/or concentration, etchant-containing precursor flow and/or concentration, deposition pressure, deposition time, deposition temperature, other deposition parameter, and/or combinations thereof. For example, silicon-containing precursor, germanium-containing precursor, dopant-containing precursor, and/or etchant-containing precursor may be continuously flowed into a process chamber during the etching sequence, but a concentration and/or a flow rate of the silicon-containing precursor, germanium-containing precursor, dopant-containing precursor, and/or etchant-containing precursor may be different for each deposition phase (i.e., deposition of epitaxial layers 154A/epitaxial layers 154B, epitaxial layers 156A/epitaxial layers 156B, and epitaxial layers 158A/epitaxial layers 158B, respectively). Deposition pressure, deposition pressure, deposition time, deposition temperature, and/or other deposition parameter may be different for each deposition phase.

The present disclosure contemplates epitaxial source/drain structures 150 having different configurations and/or different cross-sectional profiles in transistor region 106A and transistor region 106B. For example, thickness t1 of bottom epitaxial portions of epitaxial layers 154A may be different than (e.g., greater than) thickness t1 of bottom epitaxial portions of epitaxial layers 154B and/or thickness t2 of sidewall epitaxial portions of epitaxial layers 154A may be different than (e.g., greater than) thickness t2 of sidewall epitaxial portions of epitaxial layers 154B. In another example, in transistor region 106A, bottom epitaxial portions of epitaxial layers 154A are connected to bottommost sidewall epitaxial portions of epitaxial layers 154A, while in transistor region 106B, bottom epitaxial portions of epitaxial layers 154B are not connected to bottommost sidewall epitaxial portions of epitaxial layers 154B. In such embodiments, epitaxial layers 156A physically contact bottommost inner spacers 148', while epitaxial layers 156B do not physically contact bottommost inner spacers 148'. In yet another example, sidewall epitaxial portions of epitaxial layers 154A may be larger than sidewall epitaxial portions of epitaxial layers 154B, such that gaps between adjacent sidewall epitaxial portions of epitaxial layers 154A are smaller than gaps between adjacent sidewall epitaxial portions of epitaxial layers 154B. In yet another example, epitaxial layers 154A and epitaxial layers 154B have different shapes and/or epitaxial layers 156A and epitaxial layers 156B have different shapes. In yet another example, thickness t3 and/or thickness t4 of epitaxial layers 156A may be different than thickness t3 and/or thickness t4 of epitaxial layers 156B. In yet another example, epitaxial layers 156A and epitaxial layers 156B have different top surface configurations. For example, recessed top surfaces of epitaxial layers 156A may be shallower than recessed top surfaces of epitaxial layers 156B, such that a remaining depth of source/drain recesses 140 in transistor region 106A is less than a remaining depth of source/drain recesses 140 in transistor region 106B after forming epitaxial layers 156A and epitaxial layers 156B. In such embodiments, epitaxial layers 158B will extend below top surfaces of topmost semiconductor layers 120 further than epitaxial layers 158B, such that thickness t6 of epitaxial layers 158B is greater than thickness t6 of epitaxial layers 158A. In yet another example, thickness t5, thickness t6, thickness t7, and/or thickness t8 of epitaxial layers 158A may be different than thickness t5, thickness t6, thickness t7, and/or thickness t8 of epitaxial layers 158B. In yet another example, epitaxial layers 158A and epitaxial layers 158B have different shapes.

Turning to FIG. 2H (and FIG. 3I corresponding therewith), multigate device 100 can undergo further processing. For example, a dielectric layer 170 (for example, a contact etch stop layer (CESL) and an interlayer dielectric (ILD) layer) is formed over multigate device 100 and a CMP process and/or other planarization process is performed until reaching (exposing) top portions (or top surfaces) of dummy gates 130A-130C. Dielectric layer 170 is disposed over epitaxial source/drain structures 150 and between adjacent gate spacers 132. Dielectric layer 170 is formed by CVD, PVD, ALD, RPCVD, PECVD, HDPCVD, FCVD, HARP, LPCVD, ALCVD, APCVD, SACVD, MOCVD, other suitable methods, or combinations thereof. In some embodiments, ILD layer is formed by FCVD, HARP, HDPCVD, or combinations thereof. In some embodiments, the planarization process removes hard masks of dummy gates 130A-130C to expose underlying dummy gate electrodes of dummy gates 130A-130C, such as polysilicon gate electrodes. ILD layer includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, Calif.), xerogel, aerogel, amorphous fluorinated carbon, parylene, BCB-based dielectric material, SiLK (Dow Chemical, Midland, Mich.), polyimide, other suitable dielectric material, or combinations thereof. In some embodiments, ILD layer includes a dielectric material having a dielectric constant that is less than a dielectric constant of silicon dioxide (e.g., k<3.9). In some embodiments, ILD layer includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, $Si—CH_3$ bonds)), each of which is tuned/configured to exhibit a dielectric constant less than about 2.5. ILD layer can include a multilayer structure having multiple dielectric materials. CESL includes a material different than ILD layer, such as a dielectric material that is different than the dielectric material of ILD layer. For example, where ILD layer includes a dielectric material that includes silicon and oxygen and having a dielectric constant that is less than about the dielectric constant of silicon dioxide, CESL can include silicon and nitrogen, such as silicon nitride or silicon oxynitride.

A gate replacement process is then performed to replace dummy gates 130A-130C with a gate stack 160A, a gate stack 160B, and a gate stack 160C, respectively. For example, dummy gates 130A-130C are removed to form gate openings (formed between gate spacers 132 and/or inner spacers 148') that expose channel regions of semiconductor layer stacks 110 (e.g., semiconductor layers 120 and semiconductor layers 115). In some embodiments, an etching process is performed that selectively removes dummy gates 130A-130C with respect to dielectric layer 170, gate spacers 132, inner spacers 148', semiconductor layers 115, and/or semiconductor layers 120. In other words, the etching process substantially removes dummy gates 130A-130C but does not remove, or does not substantially remove, dielectric layer 170, gate spacers 132, inner spacers 148', semiconductor layers 115, and/or semiconductor layers 120. The etching process is a dry etching, a wet etching, other suitable etching process, or combinations thereof. In some embodiments, the etching process uses a patterned mask layer as an etch mask, where the patterned mask layer covers dielectric layer 170 and/or gate spacers 132 but has openings therein that expose dummy gates 130A-130C.

During the gate replacement process, before forming gate stacks 160A-160C in the gate openings, a channel release process is performed to form suspended channel layers. For example, semiconductor layers 115 exposed by the gate openings are selectively removed to form air gaps between semiconductor layers 120 and between semiconductor layers 120 and semiconductor mesas 105P', thereby suspending semiconductor layers 120 in channel regions of multigate device 100. In the depicted embodiment, each transistor region 106A and transistor region 106B has three suspended semiconductor layers 120, which are referred to hereafter as channel layers 120', vertically stacked along the z-direction for providing three channels through which current can flow between respective epitaxial source/drain structures 150 during operation of transistors of multigate device 100. In some embodiments, an etching process is performed to selectively etch semiconductor layers 115 with minimal (to no) etching of semiconductor layers 120, semiconductor mesas 105P', gate spacers 132, inner spacers 148', and/or dielectric layer 170. In some embodiments, an etchant is selected for the etch process that etches silicon germanium (i.e., semiconductor layers 115) at a higher rate than silicon (i.e., semiconductor layers 120 and semiconductor mesas 105P') and dielectric materials (i.e., gate spacers 132, inner spacers 148', and/or dielectric layer 170) (i.e., the etchant has a high etch selectivity with respect to silicon germanium). The etching process is a dry etching, a wet etching, other suitable etching process, or combinations thereof. In some embodiments, before performing the etching process, an oxidation process can be implemented to convert semiconductor layers 115 into silicon germanium oxide features, where the etching process then removes the silicon germanium oxide features. In some embodiments, during and/or after removing semiconductor layers 115, an etching process is performed to modify a profile of semiconductor layers 120 to achieve target dimensions and/or target shapes for channel layers 120.

Gate stacks 160A-160C (also referred to as high-k/metal gates) are then formed in the gate openings. Gate stacks 160A-160C are disposed between respective gate spacers 132. Gate stacks 160A-160C are further disposed between respective inner spacers 148'. Gate stacks 160A-160C are further disposed between channel layers 120' and between channel layers 120' and semiconductor mesas 105P'. In the depicted embodiment, where multigate device 100 is a GAA transistor, gate stacks 160A-160C surround channel layers 120', for example, in the Y-Z plane. In some embodiments, forming gate stacks 160A-160C includes depositing a gate dielectric layer over multigate device 100 that partially fills the gate openings, depositing a gate electrode layer over the gate dielectric layer that partially fills the gate openings, depositing a hard mask layer over the gate electrode layer that fills a remainder of the gate openings, and performing a planarization process, such as CMP, on the hard mask layer, the gate electrode layer, and/or the hard mask layer, thereby forming gate stacks 160A-160C. The deposition processes can include CVD, PVD, ALD, RPCVD, PECVD, HDPCVD, FCVD, HARP, LPCVD, ALCVD, APCVD, SACVD, MOCVD, plating, other suitable methods, or combinations thereof. Though the depicted embodiment fabricates the metal gates stacks according to a gate last process, the present disclosure contemplates embodiments where the metal gate stacks are fabricated according to a gate first process or a hybrid gate last/gate first process.

Gate stacks 160A-160C are configured to achieve desired functionality according to design requirements of multigate device 100, such that gate stacks 160A-160C may include the same or different layers and/or materials. In some embodiments, gate stacks 160A-160C include a gate dielectric (for example, a gate dielectric 162A, a gate dielectric 162B, and a gate dielectric 162C, respectively, each of which can include a gate dielectric layer) and a gate electrode (for example, a gate electrode 164A, a gate electrode 164B, and a gate electrode 164C, respectively, each of which can include a work function layer and a bulk (or fill) conductive layer). Gate stacks 160A-160C may include numerous other layers, for example, capping layers, interface layers, diffusion layers, barrier layers, hard mask layers, or combinations thereof. In some embodiments, gate dielectrics 162A-162C include a gate dielectric layer disposed over an interfacial layer (including a dielectric material, such as silicon oxide), and gate electrodes 164A-164C are disposed over gate dielectrics 162A-162C, respectively. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide ($k \approx 3.9$). For example, high-k dielectric material has a dielectric constant greater than about 3.9. In some embodiments, the gate dielectric layer is a high-k dielectric layer. Gate electrodes 164A-164C include a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, Cu, Ti, Ta, polysilicon, metal alloys, other suitable materials, or combinations thereof. Hard masks 134 include any suitable hard mask material, such as any material (e.g., silicon nitride or silicon carbonitride) that can protect gate stacks 160A-160C during subsequent processing, such as that associated with forming gate contacts and/or source/drain contacts.

Processing can then continue with forming device-level contacts, such as metal-to-poly (MP) contacts, which generally refer to contacts to gate stacks 160A-160C, and metal-to-device (MD) contacts, which generally refer to contacts to an electrically active region of multigate device 100, such as epitaxial source/drain structures 150. Device-level contacts electrically and physically connect IC device features to local contacts (interconnects), which are further described below. For example, source/drain contacts are formed by performing a lithography and etching process (such as described herein) to form contact openings that extend through dielectric layer 170 to expose epitaxial source/drain structures 150; performing a first deposition process to form a contact barrier material over dielectric layer 170 that partially fills the contact openings; and performing a second deposition process to form a contact bulk material over the contact barrier material, where the contact bulk material fills a remainder of the contact openings. In such embodiments, the contact barrier material and the contact bulk material are disposed in the contact opening and over a top surface of dielectric layer 170. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, a silicide layer is formed over epitaxial source/drain structures 150 before forming the contact barrier material (e.g., by depositing a metal layer over epitaxial layers 158A and/or epitaxial layers 158B and heating multigate device 100 to cause constituents of epitaxial layers 158A and/or epitaxial layers 158B to react with metal constituents of the metal layer). In some embodiments, the silicide layer includes a metal constituent (e.g., nickel, platinum, palladium, vanadium, titanium, cobalt, tantalum, ytterbium, zirconium, other suitable metal, or combinations thereof) and a constituent of epitaxial layers 158A and/or epitaxial layers 158B (e.g., silicon and/or germanium). A CMP process and/or other planarization process is performed to remove excess contact bulk material and contact barrier material, for example, from over the top surface of dielectric layer 170, resulting in source/drain contacts (i.e., the contact barrier layer and the contact bulk layer filling the contact openings). The CMP process planarizes a top surface of source/drain contact, such that a top surface of dielectric layer 170 and top surfaces of source/drain contacts form a substantially planar surface.

Processing can continue with forming additional features of the MLI feature, such as a middle-of-line layer (e.g., CESL, ILD layer, vias, gate contacts, and/or source/drain contacts) and BEOL structure. BEOL structure can include additional metallization layers (levels) of the MLI feature, such as a first metallization layer (i.e., a metal one (M1) layer and a via zero (V0) layer), a second metallization layer (i.e., a metal two (M2) layer and a via one (V1) layer) . . . to a topmost metallization layer (i.e., a metal X (MX) layer and a via Y (VY) layer, where X is a total number of patterned metal line layers of the MLI feature and Y is a total number of patterned via layers of the MLI feature) over the first metallization layer. Each of the metallization layers includes a patterned metal line layer and a patterned via layer configured to provide at least one BEOL interconnect structure disposed in an insulator layer. The patterned metal line layer and the patterned metal via layer are formed by any suitable process, including by various dual damascene processes, and include any suitable materials and/or layers.

Figure 5:
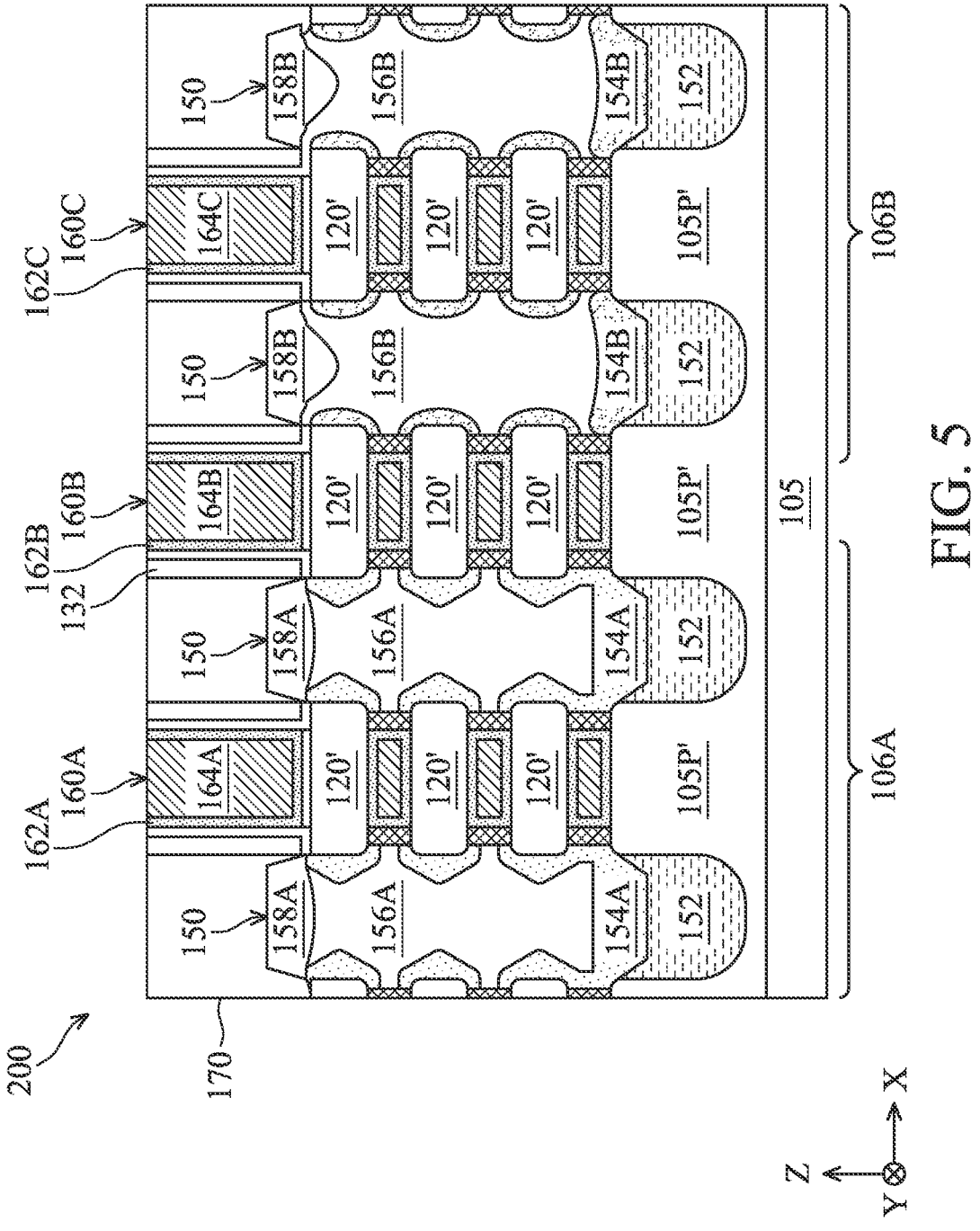
FIG. 5 is a fragmentary cross-sectional view of another multigate device having enhanced epitaxial source/drain structures, in portion or entirety, that can be fabricated by the method in FIG. 1 according to various aspects of the present disclosure

FIG. 5 is a fragmentary cross-sectional view of a multigate device 200, in portion or entirety, according to various aspects of the present disclosure. For clarity and simplicity, similar features of multigate device 100 in FIG. 1 and multigate device 200 in FIG. 5 are identified by the same reference numerals. Multigate device 200 is similar in many respects to multigate device 100, except undoped epitaxial layers 152 have a substantially flat, substantially linear top surface. In such embodiments, a thickness of undoped epitaxial layers 152 along the z-direction is substantially uniform. Multigate device 200 may be included in a microprocessor, a memory, and/or other IC device. In some embodiments, multigate device 200 is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 5 has been simplified for the sake of clarity to better understand the inventive concepts of the present disclosure. Additional features can be added in multigate device 200, and some of the features described below can be replaced, modified, or eliminated in other embodiments of multigate device 200.

Epitaxial source/drain structures for enhancing performance of multigate devices, such as fin-like field-effect transistors (FETs) or gate-all-around (GAA) FETs, and methods of fabricating the epitaxial source/drain structures, are disclosed herein. The present disclosure provides for many different embodiments. An exemplary semiconductor structure includes a first channel layer, a first gate over the first channel layer, a first epitaxial source/drain structure adjacent to the first channel layer, a second channel layer, a second gate over the second channel layer, and a second epitaxial source/drain structure adjacent to the second channel layer. The first channel layer, the first gate, the first epitaxial source/drain structure, the second channel layer, the second gate, and the second epitaxial source/drain structure are over a semiconductor substrate. The first epitaxial source/drain structure includes a first undoped semiconductor layer and a first doped semiconductor layer over the first undoped semiconductor layer, and the second epitaxial source/drain structure includes a second undoped semiconductor layer and a second doped semiconductor layer over the second undoped semiconductor layer. The first undoped semiconductor layer is between the first doped semiconductor layer and the semiconductor substrate. The second undoped semiconductor layer is between the second doped semiconductor layer and the semiconductor substrate. The first undoped semiconductor layer extends a first depth into the semiconductor substrate, the second undoped semiconductor layer extends a second depth into the semiconductor substrate, and the second depth is different than the first depth. The first channel layer has a first channel length, the second channel layer has a second channel length, and the second channel length is different than the first channel length.

In some embodiments, the first depth is greater than the second depth, and the first channel length is greater than the second channel length. In some embodiments, a first configuration of the first undoped semiconductor layer and the first doped semiconductor layer in the first epitaxial source/drain structure is different than a second configuration of the second undoped semiconductor layer and the second doped semiconductor layer in the second epitaxial source/drain structure. In some embodiments, the first doped semiconductor layer extends below a topmost surface of the semiconductor substrate a first distance and the second doped semiconductor layer extends below the topmost surface of the semiconductor substrate a second distance that is different than the first distance. In some embodiments, the first epitaxial source/drain structure has a first width, the second epitaxial source/drain structure has a second width, and the first width is different than the second width.

In some embodiments, the first channel layer is disposed over a first semiconductor mesa of the semiconductor substrate and the second channel layer is disposed over a second semiconductor mesa of the semiconductor substrate. The first undoped semiconductor layer is adjacent the first semiconductor mesa and the second undoped semiconductor layer is adjacent the second semiconductor mesa. A top surface of the first undoped semiconductor layer is a first height above a top surface of the first semiconductor mesa, a top surface of the second undoped semiconductor layer is a second height above a top surface of the second semiconductor mesa, and the first height is equal to the second height. In some embodiments, the first semiconductor mesa has a third height that is greater than the first height and the second semiconductor mesa has a fourth height that is less than the second height. In some embodiments, the first undoped semiconductor layer has a fifth height that is less than the third height and the second undoped semiconductor layer has a sixth height that is less than the fourth height.

In some embodiments, the first epitaxial source/drain structure further includes a third doped semiconductor layer over the first doped semiconductor layer and a fourth doped semiconductor layer over the third doped semiconductor layer, and the second epitaxial source/drain structure further includes a fifth doped semiconductor layer over the second doped semiconductor layer and a sixth doped semiconductor layer over the fifth doped semiconductor layer. The first doped semiconductor layer is between the first channel layer and the third doped semiconductor layer. The second doped semiconductor layer is between the second channel layer and the fifth doped semiconductor layer.

An exemplary device includes a first transistor and a second transistor. The first transistor has a first channel layer, a first gate surrounding the first channel layer, and a first epitaxial source/drain structure disposed adjacent to the first channel layer. The second transistor has a second channel layer, a second gate surrounding the second channel layer, and a second epitaxial source/drain structure disposed adjacent to the second channel layer. The first channel layer, the first gate, the first epitaxial source/drain structure, the second channel layer, the second gate, and the second epitaxial source/drain structure are disposed over a semiconductor substrate. The first epitaxial source/drain structure includes a first undoped epitaxial layer with a first trough-shaped top surface and a first doped epitaxial layer having a first inner portion having a first dopant concentration and a first outer portion having a second dopant concentration. The second dopant concentration is less than the first dopant concentration and the first outer portion of the first doped epitaxial layer is disposed between the first undoped epitaxial layer and the first inner portion of the first doped epitaxial layer. The second epitaxial source/drain structure includes a second undoped epitaxial layer with a second trough-shaped top surface and a second doped epitaxial layer having a second inner portion having the first dopant concentration and a second outer portion having the second dopant concentration. The second trough-shaped top surface is configured different than the first trough-shaped top surface. The second outer portion of the second doped epitaxial layer is disposed between the second undoped epitaxial layer and the second inner portion of the second doped epitaxial layer.

In some embodiments, a first lowest point of the first trough-shaped top surface of the first undoped epitaxial layer relative to a topmost surface of the semiconductor substrate is different than a second lowest point of the second trough-shaped top surface of the second undoped epitaxial layer relative to the topmost surface of the semiconductor substrate. In some embodiments, the first undoped epitaxial layer and the second undoped epitaxial layer are each positioned below a topmost surface of the semiconductor substrate. In some embodiments, the first channel layer has a first length, the second channel layer has a second length, and the second length is different than the first length. In some embodiments, the first undoped epitaxial layer has a first central portion disposed between first end portions, the second undoped epitaxial layer has a second central portion disposed between second end portions, the first central portion and the second central portion have different profiles, and the first end portions and the second end portions have different profiles. In some embodiments, a first distance between a bottommost point of the first outer portion of the first doped epitaxial layer and a bottommost surface of the first epitaxial source/drain structure is different than a second distance between a bottommost point of the second outer portion of the second doped epitaxial layer and a bottommost surface of the second epitaxial source/drain structure. In some embodiments, the first epitaxial source/drain structure further includes a third doped epitaxial layer disposed over the first outer portion of the first doped epitaxial layer, the second epitaxial source/drain structure further includes a fourth doped epitaxial layer disposed over the second outer portion of the second doped epitaxial layer, the third doped epitaxial layer has a first thickness, and the fourth doped epitaxial layer has a second thickness different than the first thickness.

An exemplary method includes forming a first source/drain recess that extends through first semiconductor layers to a first depth into a semiconductor substrate and a second source/drain recess that extends through second semiconductor layers to a second depth into the semiconductor substrate. The first depth is different than the second depth, the first source/drain recess is in a first active region of a first size, and the second source/drain recess is in a second active region of a second size that is different than the first size. The method further includes forming a first undoped epitaxial layer in the first source/drain recess and a second undoped epitaxial layer in the second source/drain recess. A first thickness of the first undoped epitaxial layer is less than the first depth and a second thickness of the second undoped epitaxial layer is less than the second depth. The method further includes forming a first doped epitaxial layer in the first source/drain recess and over the first undoped epitaxial layer and a second doped epitaxial layer in the second source/drain recess and over the second undoped epitaxial layer.

In some embodiments, the first undoped epitaxial layer and the second undoped epitaxial layer and the first doped epitaxial layer and the second doped epitaxial layer are formed ex-situ. In some embodiments, forming the first undoped epitaxial layer and the second undoped epitaxial layer includes performing a selective chemical vapor deposition process and performing an etching process after the selective chemical vapor deposition process. In some embodiments, the selective chemical vapor deposition process and the etching process are performed in-situ. In some embodiments, the first depth is greater than a first distance between a topmost surface of the first semiconductor layers and a topmost surface of the semiconductor substrate and the second depth is less than a second distance between a topmost surface of the second semiconductor layers and the topmost surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a semiconductor substrate;
   a first channel stack, a first gate over the first channel stack, and a first epitaxial source/drain structure adjacent to the first channel stack, wherein the first channel stack, the first gate, and the first epitaxial source/drain structure are over the semiconductor substrate, and further wherein the first epitaxial source/drain structure includes:
   a first undoped semiconductor layer, and
   a first doped semiconductor layer over the first undoped semiconductor layer, wherein the first undoped semiconductor layer is between the first doped semiconductor layer and the semiconductor substrate;
   a second channel stack, a second gate over the second channel stack, and a second epitaxial source/drain structure adjacent to the second channel stack, wherein the second channel stack, the second gate, and the second epitaxial source/drain structure are over the semiconductor substrate, and further wherein the second epitaxial source/drain structure includes:
   a second undoped semiconductor layer, and
   a second doped semiconductor layer over the second undoped semiconductor layer, wherein the second undoped semiconductor layer is between the second doped semiconductor layer and the semiconductor substrate;

wherein the first undoped semiconductor layer extends a first depth into the semiconductor substrate, the second undoped semiconductor layer extends a second depth into the semiconductor substrate, and the second depth is different than the first depth;

wherein the first channel stack has a first channel length and a height, the second channel stack has a second channel length and the height, and the second channel length is different than the first channel length; and wherein the first depth and the second depth are configured relative to the height based on the first channel length and the second channel length, respectively, wherein the first depth is less than the height if the first channel length is less than 20 nm, the first depth is greater than the height if the first channel length is greater than 20 nm, the second depth is less than the height if the second channel length is less than 20 nm, and the second depth is greater than the height if the second channel length is greater than 20 nm.

2. The semiconductor structure of claim 1, wherein the first depth is greater than the second depth, the first depth is greater than the height, the second depth is less than the height, and the first channel length is greater than the second channel length.

3. The semiconductor structure of claim 1, wherein a first configuration of the first undoped semiconductor layer and the first doped semiconductor layer in the first epitaxial source/drain structure is different than a second configuration of the second undoped semiconductor layer and the second doped semiconductor layer in the second epitaxial source/drain structure.

4. The semiconductor structure of claim 1, wherein a first ratio of the height to the first depth is greater than one, a second ratio of the height to the second depth is less than one, the first depth is less than the second depth, and the first channel length is less than the second channel length.

5. The semiconductor structure of claim 1, wherein the first epitaxial source/drain structure has a first width, the second epitaxial source/drain structure has a second width, and the first width is different than the second width.

6. The semiconductor structure of claim 1, wherein a first ratio of the height to the first depth is 1 to 4 if the first channel length is less than 20 nm, the first ratio of the height to the first depth is 0.5 to 0.9 if the first channel length is greater than 20 nm, a second ratio of the height to the second depth is 1 to 4 if the second channel length is less than 20 nm, and the second ratio of the height to the second depth is 0.5 to 0.9 if the second channel length is greater than 20 nm.

7. The semiconductor structure of claim 1, wherein:

the first doped semiconductor layer has a first thickness that is greater than the height, such that the first doped semiconductor layer extends a third depth into the semiconductor substrate, wherein the third depth is less than the first depth and the second depth;

the second doped semiconductor layer has a second thickness that is greater than the height, such that the second doped semiconductor layer extends a fourth depth into the semiconductor substrate, wherein the fourth depth is different than the third depth and the third depth is less than the first depth and the second depth; and the third depth and the fourth depth depend on the first channel length and the second channel length, respectively.

8. The semiconductor structure of claim 1, wherein:

the first epitaxial source/drain structure further includes a third doped semiconductor layer over the first doped semiconductor layer and a fourth doped semiconductor layer over the third doped semiconductor layer, wherein the first doped semiconductor layer is between the first channel stack and the third doped semiconductor layer; and the second epitaxial source/drain structure further includes a fifth doped semiconductor layer over the second doped semiconductor layer and a sixth doped semiconductor layer over the fifth doped semiconductor layer, wherein the second doped semiconductor layer is between the second channel stack and the fifth doped semiconductor layer.

9. A device comprising:

a first transistor having a first channel layer, a first gate surrounding the first channel layer, and a first epitaxial source/drain structure disposed adjacent to the first channel layer, wherein the first channel layer, the first gate, and the first epitaxial source/drain structure are disposed over a semiconductor substrate and the first epitaxial source/drain structure includes:

a first undoped epitaxial layer with a first trough-shaped top surface, such that the first undoped epitaxial layer forms a first trough, and a first doped epitaxial layer that fills the first trough of the first undoped epitaxial layer, the first doped epitaxial layer having a first inner portion having a first dopant concentration and a first outer portion having a second dopant concentration, wherein the second dopant concentration is less than the first dopant concentration and the first outer portion of the first doped epitaxial layer is disposed between the first undoped epitaxial layer and the first inner portion of the first doped epitaxial layer; and a second transistor having a second channel layer, a second gate surrounding the second channel layer, and a second epitaxial source/drain structure disposed adjacent to the second channel layer, wherein the second channel layer, the second gate, and the second epitaxial source/drain structure are disposed over the semiconductor substrate and the second epitaxial source/drain structure includes:

a second undoped epitaxial layer with a second trough-shaped top surface such that the second undoped epitaxial layer forms a second trough, wherein;

the second trough-shaped top surface is configured different than the first trough-shaped top surface, the first trough-shaped top surface is configured based on a first active region size corresponding with the first transistor, the second trough-shaped top surface is configured based on a second active region size corresponding with the second transistor, the first active region size is greater than 30 nm, and the second active region size is less than 30 nm;

the first undoped epitaxial layer has a first minimum thickness, the first trough-shaped top surface has a first depth, the second undoped epitaxial layer has a second minimum thickness, and the second trough-shaped top surface has a second depth; and a first ratio of the first depth to the first minimum thickness is 0.1 to 0.5 and a second ratio of the second depth to the second minimum thickness is 0.05 to 0.3, and a second doped epitaxial layer that fills the second trough of the second undoped epitaxial layer, the second doped epitaxial layer having a second inner portion having the first dopant concentration and a second outer portion having the second dopant concentration, wherein the second outer portion of the second doped epitaxial layer is disposed between the second undoped epitaxial layer and the second inner portion of the second doped epitaxial layer.

10. The device of claim 9, wherein a first lowest point of the first trough-shaped top surface of the first undoped epitaxial layer relative to a topmost surface of the semiconductor substrate is different than a second lowest point of the second trough-shaped top surface of the second undoped epitaxial layer relative to the topmost surface of the semiconductor substrate.

11. The device of claim 9, wherein the first undoped epitaxial layer and the second undoped epitaxial layer are each positioned below a topmost surface of the semiconductor substrate.

12. The device of claim 9, wherein the first channel layer has a first length, the second channel layer has a second length, and the second length is different than the first length.

13. The device of claim 9, wherein the first undoped epitaxial layer has a first central portion disposed between first end portions, the second undoped epitaxial layer has a second central portion disposed between second end portions, the first central portion and the second central portion have different profiles, and the first end portions and the second end portions have different profiles.

14. The device of claim 9, wherein a first distance between a bottommost point of the first outer portion of the first doped epitaxial layer and a bottommost surface of the first epitaxial source/drain structure is different than a second distance between a bottommost point of the second outer portion of the second doped epitaxial layer and a bottommost surface of the second epitaxial source/drain structure.

15. The device of claim 9, wherein:

the first epitaxial source/drain structure further includes a third doped epitaxial layer disposed over the first outer portion of the first doped epitaxial layer;

the second epitaxial source/drain structure further includes a fourth doped epitaxial layer disposed over the second outer portion of the second doped epitaxial layer; and wherein the third doped epitaxial layer has a first thickness and the fourth doped epitaxial layer has a second thickness different than the first thickness.

16. A semiconductor structure comprising:

a first semiconductor layer extending between first source/drain structures, wherein the first semiconductor layer is disposed over a first semiconductor mesa and at least one of the first source/drain structures includes:

a first undoped semiconductor layer, and a first doped semiconductor layer over the first undoped semiconductor layer, wherein the first undoped semiconductor layer is between the first doped semiconductor layer and the first semiconductor mesa;

a second semiconductor layer extending between second source/drain structures, wherein the second semiconductor layer is disposed over a second semiconductor mesa and at least one of the second source/drain structures includes:

a second undoped semiconductor layer, and a second doped semiconductor layer over the second undoped semiconductor layer, wherein the second undoped semiconductor layer is between the second doped semiconductor layer and the second semiconductor mesa;

wherein a first distance is between a bottom of the first undoped semiconductor layer and a top of the first semiconductor mesa, a second distance is between a bottom of the second undoped semiconductor layer and a top of the second semiconductor mesa, and the second distance is greater than the first distance;

wherein a third distance is between a top of the first semiconductor layer and the top of the first semiconductor mesa, a fourth distance is between a top of the second semiconductor layer and the top of the second semiconductor mesa, the third distance is less than the first distance, and the fourth distance is greater than the second distance;

wherein the first semiconductor layer has a first length between the first source/drain structures, the second semiconductor layer has a second length between the second source/drain structures, and the second length is greater than the first length; and wherein a first ratio of the third distance to the first distance is at least 1 and a second ratio of the fourth distance to the second distance is less than 1.

17. The semiconductor structure of claim 16, wherein:

the first undoped semiconductor layer has a first top concave surface;

the second undoped semiconductor layer has a second top concave surface; and a fifth distance is between a bottom of the first concave top surface and the top of the first semiconductor mesa, a sixth distance is between a bottom of the second top concave surface and the top of the second semiconductor mesa, and the sixth distance is greater than the fifth distance.

18. The semiconductor structure of claim 16, wherein:

the first undoped semiconductor layer wraps a bottom portion of the first doped semiconductor layer; and the second undoped semiconductor layer wraps a bottom portion of the second doped semiconductor layer.

19. The semiconductor structure of claim 16, wherein:

the first ratio of the third distance to the first distance is 1 to 4; and the second ratio of the fourth distance to the second distance is 0.5 to 0.9.

20. The semiconductor structure of claim 19, wherein the first distance is the same as the second distance.

* * * * *